(12) United States Patent
Kim et al.

(10) Patent No.: US 9,972,527 B2
(45) Date of Patent: May 15, 2018

(54) SEMICONDUCTOR DEVICE INCLUDING AIR SPACER

(71) Applicant: SAMSUNG ELECTRONICS CO., LTD., Suwon-si, Gyeonggi-Do (KR)

(72) Inventors: Kyung-Eun Kim, Seoul (KR); Yong-Kwan Kim, Yongin-si (KR); Se-Myeong Jang, Gunpo-si (KR); Yoo-Sang Hwang, Suwon-si (KR); Bong-Soo Kim, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/263,822

(22) Filed: Sep. 13, 2016

(65) Prior Publication Data

US 2017/0154805 A1 Jun. 1, 2017

(30) Foreign Application Priority Data

Nov. 27, 2015 (KR) .................. 10-2015-0167508

(51) Int. Cl.
*H01L 21/00* (2006.01)
*H01L 21/768* (2006.01)
(Continued)

(52) U.S. Cl.
CPC ...... *H01L 21/7682* (2013.01); *G11C 11/4082* (2013.01); *G11C 11/4087* (2013.01); *G11C 11/4091* (2013.01); *H01L 21/76816* (2013.01); *H01L 21/76877* (2013.01); *H01L 21/76897* (2013.01); *H01L 23/528* (2013.01); *H01L 23/5226* (2013.01); *H01L 23/5329* (2013.01); *H01L 27/10885* (2013.01); *G11C 11/40615* (2013.01)

(58) Field of Classification Search
CPC .................................................. H01L 21/7682
See application file for complete search history.

(56) References Cited

U.S. PATENT DOCUMENTS 8,987,860 B2 3/2015 Song et al.
8,999,837 B2 4/2015 Park et al.
(Continued)

FOREIGN PATENT DOCUMENTS

KR 1020140082281 7/2014
KR 1020150012033 2/2015

*Primary Examiner* — William Harriston
(74) *Attorney, Agent, or Firm* — F. Chau & Associates, LLC

(57) ABSTRACT

A semiconductor device includes a substrate including a plurality of active areas. A conductive pattern is in contact with an active area. First and second conductive line structures face first and second side walls of the conductive pattern. An air spacer is disposed between the first and second side walls. The first and second conductive line structures include a conductive line and a conductive line mask layer. The conductive line mask layer includes a lower portion having a first width and an upper portion having a second width narrower than the first width. The air spacer includes a first air spacer disposed on a side wall of the lower portion of the conductive line mask layer and a second air spacer disposed on a side wall of the upper portion of the conductive line mask layer. The second air spacer is connected with the first air spacer.

19 Claims, 37 Drawing Sheets

(51) Int. Cl.
  *G11C 11/408*    (2006.01)
  *G11C 11/4091*   (2006.01)
  *H01L 23/522*    (2006.01)
  *H01L 23/528*    (2006.01)
  *H01L 23/532*    (2006.01)
  *H01L 27/108*    (2006.01)
  *G11C 11/406*    (2006.01)

(56) References Cited

U.S. PATENT DOCUMENTS

| | | |
|---|---|---|
| 2013/0292847 A1 | 11/2013 | Choi et al. |
| 2013/0328199 A1 | 12/2013 | Yun et al. |
| 2014/0110816 A1 | 4/2014 | Kim et al. |
| 2014/0175659 A1 | 6/2014 | Lee et al. |
| 2014/0231892 A1 | 8/2014 | Song et al. |
| 2014/0367775 A1 | 12/2014 | Min |
| 2015/0035050 A1 | 2/2015 | Yeom et al. |
| 2015/0126013 A1 | 5/2015 | Hwang et al. |
| 2015/0179651 A1 | 6/2015 | Park et al. |
| 2016/0351501 A1* | 12/2016 | Chun ................. H01L 23/5329 |

\* cited by examiner

SEMICONDUCTOR DEVICE INCLUDING AIR SPACER

CROSS-REFERENCE TO RELATED APPLICATION

This application claims priority under 35 U.S.C. § 119 to Korean Patent Application No. 10-2015-0167508, filed on Nov. 27, 2015, in the Korean Intellectual Property Office, the disclosure of which is incorporated by reference herein in its entirety.

TECHNICAL FIELD

Exemplary embodiments of the present inventive concept relate to a semiconductor device, and more particularly, to a semiconductor device including an air spacer.

DISCUSSION OF RELATED ART

Electronic devices may be relatively small and relatively light. Thus, relatively small semiconductor devices having a high degree of integration may be included in small and light electronic devices. In highly-scaled semiconductor devices, a separation distance between a plurality of conductive lines and a conductive pattern such as a plurality of contact plugs disposed between the conductive lines may be increasingly reduced, and thus a parasitic capacitance increase may reduce an operation speed or refresh characteristic of the semiconductor devices.

SUMMARY

An exemplary embodiment of the present inventive concept provides a highly integrated semiconductor device including an air spacer, which reduces a parasitic capacitance in a semiconductor device having a fine unit cell size.

According to an exemplary embodiment of the present inventive concept, a semiconductor device includes a substrate including a plurality of active areas. A conductive pattern is in contact with an active area of the plurality of active areas. First and second conductive line structures respectively face first and second side walls of the conductive pattern. An air spacer is disposed between the first and second side walls. Each of the first and second conductive line structures includes a conductive line and a conductive line mask layer covering a top and a side of the conductive line. The conductive line mask layer includes a lower portion having a first width and an upper portion having a second width narrower than the first width. The air spacer includes a first air spacer disposed on a side wall of the lower portion of the conductive line mask layer and a second air spacer disposed on a side wall of the upper portion of the conductive line mask layer. The second air spacer is connected with the first air spacer.

According to an exemplary embodiment of the present inventive concept, a semiconductor device includes a substrate including a plurality of active areas. A conductive pattern is electrically connected to the plurality of active areas. First and second conductive line structures respectively face side walls of the conductive pattern. An air spacer is disposed between the side walls of the conductive pattern. Each of the first and second conductive line structures includes a conductive line and a conductive line mask layer covering a top and a side of the conductive line. Each of the first and second conductive line structures includes a lower portion having a substantially constant width, and an upper portion having a width narrower than a width of the lower portion. The air spacer has a non-linear shape.

According to an exemplary embodiment of the present inventive concept, a semiconductor device includes a substrate including a plurality of active areas. A conductive pattern is in contact with an active area of the plurality of active areas. First and second conductive line structures respectively face first and second side walls of the conductive pattern. An air spacer is disposed between the first and second side walls. Each of the first and second conductive line structures includes a conductive line and a conductive line mask layer covering a top and a side of the conductive line. The conductive line mask layer includes a lower portion having a first width and an upper portion having a second width narrower than the first width. The air spacer extends along a side wall of the lower portion of the conductive line mask layer in a vertical direction with respect to an upper surface of the substrate and extends to a portion of a side wall of the upper portion of the conductive line mask layer.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
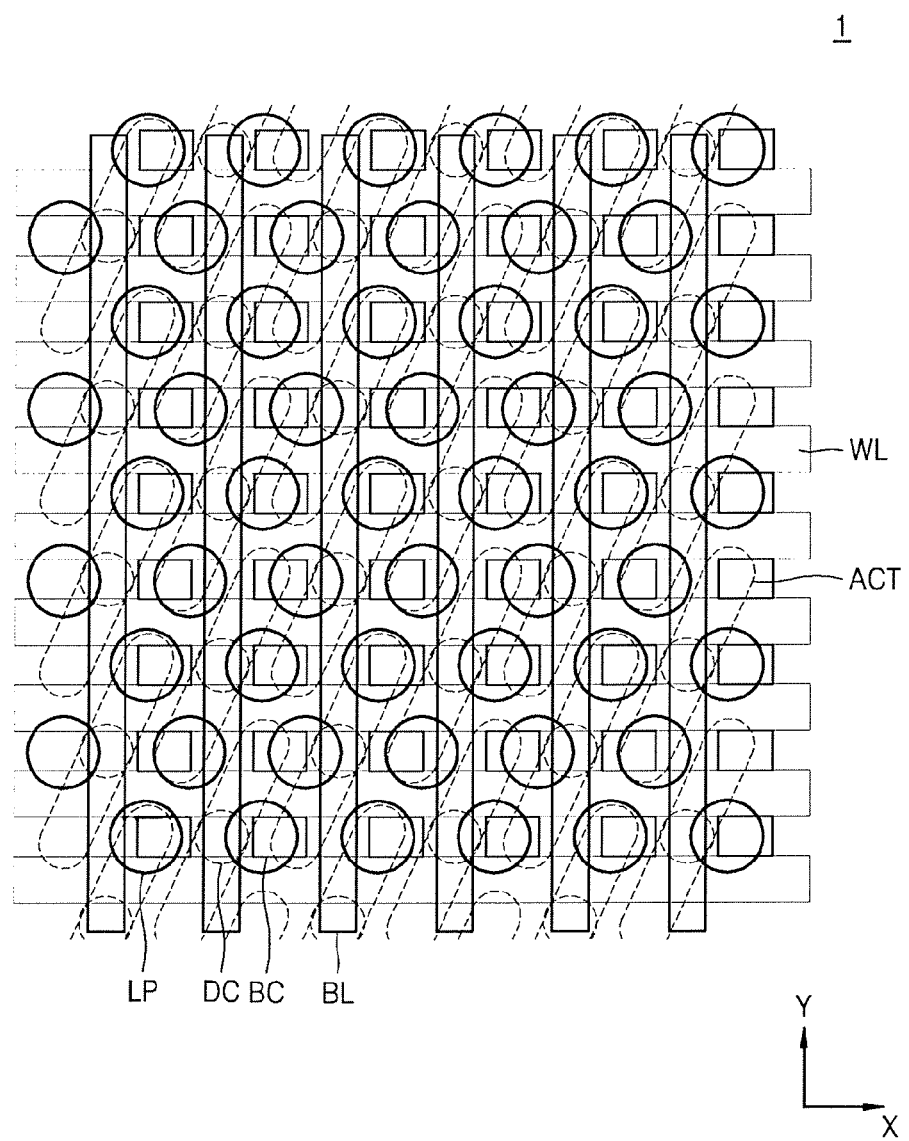
FIG. 1 is a schematic layout of a semiconductor device according to an exemplary embodiment of the present inventive concept.

Exemplary embodiments of the present inventive concept will be described in more detail below with reference to the accompanying drawings, in which exemplary embodiments of the present inventive concept are shown. Exemplary embodiments of the present inventive concept may, however, be embodied in many different forms and should not be construed as limited to the embodiments set forth herein. Like reference numerals in the specification and drawings may denote like elements.

Modifications of an illustrated or described shape may be expected according to, for example, manufacturing technology and/or a process difference. Exemplary embodiments of the present inventive concept should not be construed as being limited to a specific illustrated or described shape of a region, and for example, should include a shape change caused in a manufacturing process.

Some exemplary embodiments of the present inventive concept are illustrated in the drawings, in terms of functional blocks, units and/or modules. Those skilled in the art will appreciate that these blocks, units and/or modules may be physically implemented by electronic (or optical) circuits such as logic circuits, discrete components, microprocessors, hard-wired circuits, memory elements, wiring connections, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module according to some exemplary embodiments of the present inventive concept may be physically separated into two or more interacting and discrete blocks, units and/or modules without departing from the scope of the present inventive concept. The blocks, units and/or modules some exemplary embodiments of the present inventive concept may be physically combined into more complex blocks, units and/or modules without departing from the spirit and scope of the present inventive concept.

FIG. 1 is a schematic layout of a semiconductor device according to an embodiment.

Referring to FIG. 1, a semiconductor device 1 may include a plurality of active areas ACT. The plurality of active areas ACT may each have a rectangular shape which has a short axis and a long axis. Each of the plurality of active areas ACT may have a long axis which extends in a diagonal direction with respect to a first direction (e.g., an X direction). A plurality of word lines WL may extend in parallel with each other across the plurality of active areas ACT along the first direction (e.g., the X direction). The plurality of word lines WL may be spaced apart from each other at substantially equal intervals. A plurality of bit lines BL may be arranged above the plurality of word lines WL and may extend in parallel with each other along a second direction (e.g., a Y direction) different from the first direction (e.g., the X direction). The second direction (e.g., the Y direction) may be substantially perpendicular to the first direction (e.g., the X direction).

The plurality of bit lines BL may each be connected to an active area ACT of the plurality of active areas ACT through a direct contact DC of a plurality of direct contacts DC. One active area ACT may be electrically connected to one direct contact DC.

A plurality of buried contacts BC may be formed between two adjacent bit lines BL among the plurality of bit lines BL. In some exemplary embodiments of the present inventive concept, the plurality of buried contacts BC may be spaced apart from each other along the second direction (e.g., the Y direction) which may be a lengthwise direction of a space between two adjacent bit lines BL.

An air spacer may be formed between a corresponding bit line BL and the plurality of buried contacts BC. The air spacer and a method of forming the air spacer will be described in more detail below with reference to FIGS. 2A, 2B, 3A, 3B, 4A, 4B, 5A, 5B, 6A, 6B, 7A, 7B, 8A, 8B, 9A, 9B and 10 to 26.

The plurality of buried contacts BC may electrically connect a capacitor lower electrode to a corresponding active area ACT. One active area ACT may be electrically connected to two buried contacts BC.

A plurality of landing pads LP may each be electrically connected to a buried contact BC of the plurality of buried contacts BC. The plurality of landing pads LP may each overlap at least a portion of a corresponding bit line BL. The plurality of landing pads LP may each electrically connect lower electrodes of a plurality of capacitors to a corresponding active area ACT. The lower electrodes of the plurality of capacitors may be electrically connected to a corresponding active area ACT through a corresponding buried contact BC and a corresponding landing pad LP.

One buried contact BC and one landing pad LP which correspond to each other may be referred to as a contact plug and may be respectively referred to as a first contact plug BC and a second contact plug LP.

FIGS. 2A, 2B, 3A, 3B, 4A, 4B, 5A, 5B, 6A, 6B, 7A, 7B, 8A, 8B, 9A and 9B are cross-sectional views illustrating a method of manufacturing a semiconductor device according to an exemplary embodiment of the present inventive concept. FIGS. 2A, 3A, 4A, 5A, 6A, 7A, 8A and 9A and FIGS. 2B, 3B, 4B, 5B, 6B, 7B, 8B and 9B are cross-sectional views taken along different directions. FIGS. 2A, 3A, 4A, 5A, 6A, 7A, 8A and 9A are cross-sectional views of a portion corresponding to a cross-sectional surface which extends along the first direction (e.g., the X direction) between two adjacent word lines WL in FIG. 1, and FIGS. 2B, 3B, 4B, 5B, 6B, 7B, 8B and 9B are cross-sectional views of a portion corresponding to a cross-sectional surface which extends along the second direction (e.g., the Y direction) between two adjacent bit lines BL in FIG. 1.

Figure 2A:
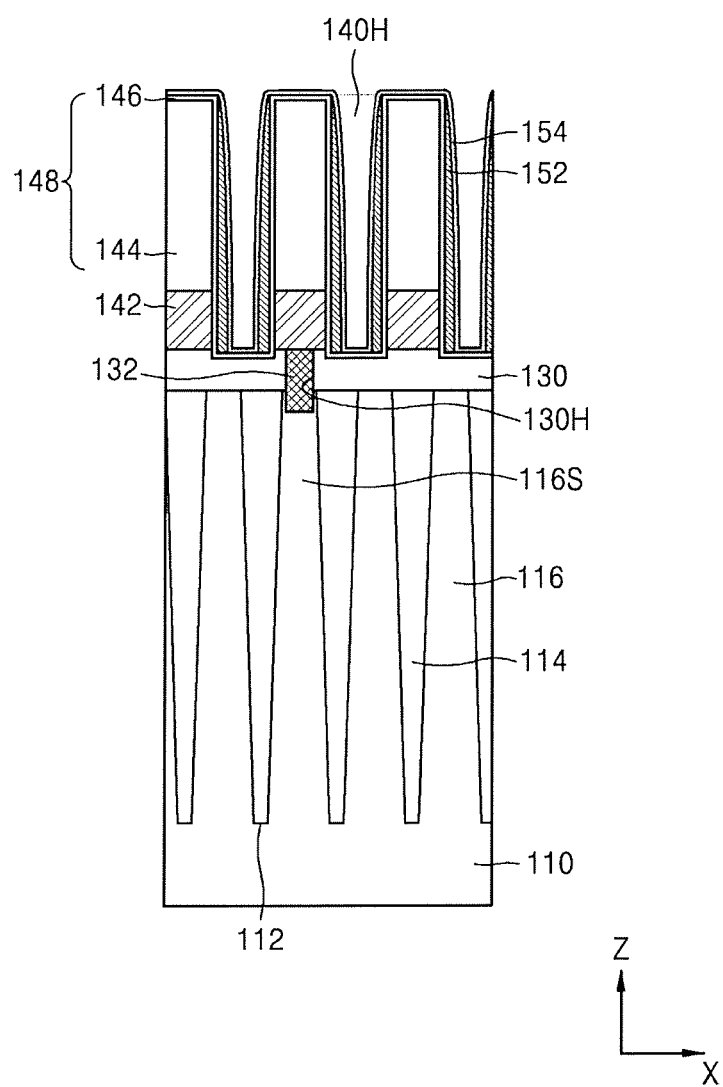
FIGS. 2A, 2B, 3A, 3B, 4A, 4B, 5A, 5B, 6A, 6B, 7A, 7B, 8A, 8B, 9A and 9B are cross-sectional views illustrating a method of manufacturing a semiconductor device according to an exemplary embodiment of the present inventive concept.
Figure 2B:
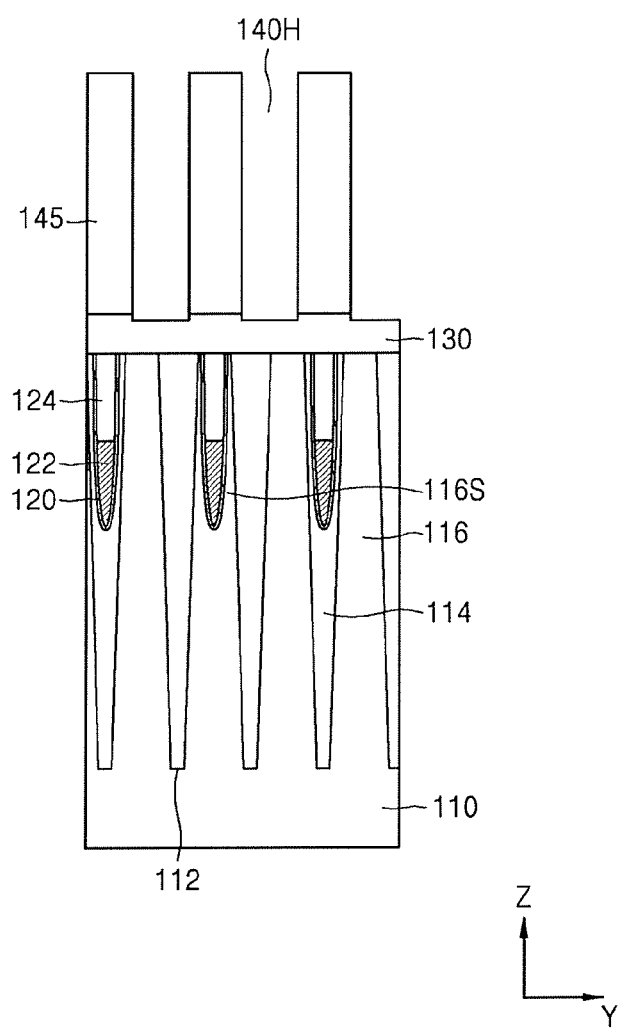

Referring to FIGS. 2A and 2B, an isolation layer 112 may be formed on a substrate 110, and a plurality of active areas 116 may be defined on the substrate 110 by the isolation layer 112. The plurality of active areas 116 may each have a rectangular shape which has a short axis and a long axis.

The substrate 110 may include, for example, silicon (Si) (e.g., crystalline Si, polycrystalline Si, or amorphous Si). The substrate 110 may include a semiconductor element such as germanium (Ge) or a compound semiconductor such as silicon carbide (SiC), gallium arsenide (GaAs), indium arsenide (InAs), and indium phosphide (InP). The substrate 110 may have a silicon-on insulator (SOI) structure. For example, the substrate 110 may include a buried oxide layer (BOX). The substrate 110 may include a conductive area (e.g., a well on which impurities are doped) or a structure on which impurities are doped.

The isolation layer 112 may include, for example, a material including at least one of silicon oxide, silicon nitride, and silicon oxynitride. The isolation layer 112 may be a single layer including one kind of insulator, a double layer including two kinds of insulators, or a multilayer including a combination of at least three kinds of insulators. For example, the isolation layer 112 may include two kinds of different insulators. For example, the isolation layer 112 may include silicon oxide and silicon nitride. For example, the isolation layer 112 may include a triple layer including silicon oxide, silicon nitride, and silicon oxynitride.

After the isolation layer 112 is formed, a plurality of word line trenches may be formed on the substrate 110. The plurality of word line trenches may extend in parallel and may each have a line shape crossing the plurality of active areas 116. In some exemplary embodiments of the present inventive concept, an isolation area 114 and the substrate 110 may be etched by separate etch processes and a step height may be formed on a bottom of each of the plurality of word line trenches, and thus, an etching depth of the isolation area 114 may differ from that of the substrate 110.

An end material where the plurality of word line trenches are formed may be cleaned, and then, a plurality of gate dielectric layers 120, a plurality of word lines 122, and a plurality of buried insulation layers 124 may be sequentially formed in the plurality of word line trenches.

The plurality of word lines 122 may extend in parallel with each other along the first direction (e.g., the X direction).

In some exemplary embodiments of the present inventive concept, the plurality of word lines 122 may be formed, and then, a source/drain area may be formed in a portion of the substrate 110 (e.g., a partial upper portion of each of the active areas 116) corresponding to opposite sides of each of the word lines 122. An impurity ion may be injected into the substrate 110 for forming the source/drain area. In some exemplary embodiments of the present inventive concept, an impurity ion injection process for forming the source/drain area may be performed before the plurality of word lines 122 are formed.

A top of each of the plurality of word lines 122 may be disposed on a level lower in position than a top of the substrate 110. A bottom of each of the plurality of word lines 122 may have a concave-convex shape, and a transistor having a saddle pin structure may be formed in the active area 116. In some exemplary embodiments of the present inventive concept, the plurality of word lines 122 may each include at least one material selected from among titanium (Ti), TiN, tantalum (Ta), TaN, tungsten (W), WN, TiSiN, and WSiN.

In some exemplary embodiments of the present inventive concept, a level may refer to a vertical-direction height from a main surface of the substrate 110. The same level or a constant level may refer to the same position or a certain position in vertical-direction height from the main surface of the substrate 110, and a low/high level may refer to a low/high position in vertical-direction height from the main surface of the substrate 110.

The gate dielectric layer 120 may include at least one material selected from among silicon oxide, silicon nitride, silicon oxynitride, oxide/nitride/oxide (ONO), and a high-k dielectric film having a dielectric constant higher than that of silicon oxide. For example, the gate dielectric layer 120 may have a dielectric constant of from about 10 to about 25. In some exemplary embodiments of the present inventive concept, the gate dielectric layer 120 may include at least one material selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 120 may include $HfO_2$, $Al_2O_3$, $HfAlO_3$, $Ta_2O_3$, and/or $TiO_2$.

A top of each of the plurality of buried insulation layer 124 may be disposed on a level which is approximately the same as that of a top of the substrate 110. The buried insulation layer 112 may include silicon oxide, silicon nitride, silicon oxynitride, or a combination thereof.

After the word lines 112 and the buried insulation layers are formed, an insulation layer pattern 130 including a plurality of openings 130H may be formed on the substrate 110. The plurality of openings 130H may expose a plurality of source areas 116S among the plurality of active areas 116. The insulation layer pattern 130 may have a thickness of from about 200 Å to about 400 Å. The insulation layer pattern 130 may include silicon oxide. For example, the insulation layer pattern 130 may include tetraethylorthosilicate (TEOS), high density plasma (HDP), or boro-phospho silicate glass (BPSG).

A plurality of direct contacts 132, which may each be connected to one of the active layers 116, may be formed by filling a conductive material into the plurality of openings 130H included in the insulation layer pattern 130. In a process of forming the insulation layer pattern 130 including the plurality of openings 130H, a portion of the substrate 110 exposed by each of the openings 130H may be removed, and the plurality of direct contacts 132 may extend to inside the substrate 110. A portion of the active areas 116 contacting each of the direct contacts 132 may be a source area 116S. One direct contact 132 may be electrically connected to one active area 116.

A plurality of bit lines 142, which are spaced apart from each other and extend in parallel with each other, may be formed on the insulation layer pattern 130 and the plurality of direct contacts 132. Each of the bit lines 142 may be referred to as a conductive line 142. The plurality of bit lines 142 may be spaced apart from each other and extend in parallel with each other along the second direction (e.g., the Y direction).

In some exemplary embodiments of the present inventive concept, each of the bit lines 142 may be a conductive line which includes at least one material selected from among semiconductor with impurities doped thereon, metal, conductive metal nitride, and metal silicide. In some exemplary embodiments of the present inventive concept, the bit lines 142 may have a stacked structure. For example, the bit lines 142 may have a stacked structure which includes doped polysilicon and metal nitride or metal such as W, and/or TiN. In some exemplary embodiments of the present inventive concept, the bit lines 142 may further include metal silicide provided between doped polysilicon and metal nitride or metal, such as W, and/or TiN. The plurality of bit lines 142 may each be electrically connected to a direct contact 132 of the plurality of direct contacts 132.

A plurality of insulation capping lines 144 covering a top of each of the bit lines 142 may be respectively formed on the bit lines 142. The insulation capping lines 144 may each include, for example, silicon nitride. A thickness of each of the insulation capping lines 144 may be greater than that of each of the bit lines 142.

A bit line material layer and an insulation capping line material layer may be sequentially formed on the substrate 110, and then, the bit lines 142 and the insulation capping lines 144 may be formed by substantially simultaneously etching the bit line material layer and the insulation capping line material layer. Thus, the insulation capping lines 144 may be spaced apart from each other and extend in parallel with each other along the second direction (e.g., the Y direction), on the respective bit lines 142. A width of each of the insulation capping lines 144 in the first direction (e.g., the X direction) may be substantially the same as that of each of the bit lines 142 in the first direction (e.g., the X direction). In some exemplary embodiments of the present inventive concept, a portion of the insulation layer pattern 130 may be etched by over-etching the bit line material layer, and thus, a stepped portion may be formed in a top of the insulation layer pattern 130.

A bit line cover layer 146 may be formed on at least one side of each of the bit lines 142, at least one side of each of the insulation capping lines 144, and a top of each of the insulation capping lines 144. The bit line cover layer 146 may include, for example, silicon nitride. In some exemplary embodiments of the present inventive concept, the bit line cover layer 146 may be conformally formed to have a thickness of from about 30 Å to about 80 Å. The insulation capping lines 144 and the bit line cover layer 146 may be referred to as a bit line mask layer 148 or a conductive line mask layer 148. The bit lines 142, the insulation capping lines 144, and the bit line cover layer 146 may be referred to as a bit line structure or a conductive line structure. A line-shaped space may be formed between the bit line structures (e.g., between a bit line cover layer 146 and an insulation capping line 144; and between an insulation capping line 144 and a bit line 142).

A first sacrificial spacer 152 may be formed on a side wall of each of the bit lines 142 where the bit line mask layer 148 is provided, for example, on a side wall of the bit line structure. A first spacer cover layer 154 may be formed on the first sacrificial spacer 152.

A first auxiliary sacrificial spacer layer, which conformally covers the substrate 110 on which the bit line cover layer 146 is formed, may be formed, and then, the first sacrificial spacer 152 may be formed through an etch back process. The first sacrificial spacer 152 may include, for example, oxide, SiGe compounds, or a polymer. However, exemplary embodiments of the present inventive concept are not limited thereto.

The first spacer cover layer 154 may conformally cover the substrate 110 on which the bit line cover layer 146 is formed. The first spacer cover layer 154 may include, for example, silicon nitride, and/or silicon oxynitride. The first spacer cover layer 154 may have a thickness of from about 20 Å to about 100 Å.

Referring to FIG. 2A, the bit line cover layer 146 may remain in a top of each of the insulation capping lines 144. However, exemplary embodiments of the present inventive concept are not limited thereto. In some exemplary embodiments of the present inventive concept, a partially upper portion of the bit line mask layer 148 including a portion of the bit line cover layer 146 covering the top of each of the insulation capping lines 144 may be partially damaged in a process of forming the first sacrificial spacer 152. A partially upper portion of the bit line mask layer 148 may be partially damaged when performing an etch process or the etch back process. The etch process or etch back process will be described below in more detail.

A fence layer 145 limiting a first contact hole 140H may be formed between adjacent bit line structures. The fence layer 145 may be disposed on the word lines 120 along a space between the bit line structures which include the bit lines 142, the insulation capping lines 144, and the bit line cover layer 146. The fence layer 145 may include, for example, silicon nitride. In some exemplary embodiments of the present inventive concept, the fence layer 145 may include silicon oxide, and/or silicon nitride.

Figure 3A:
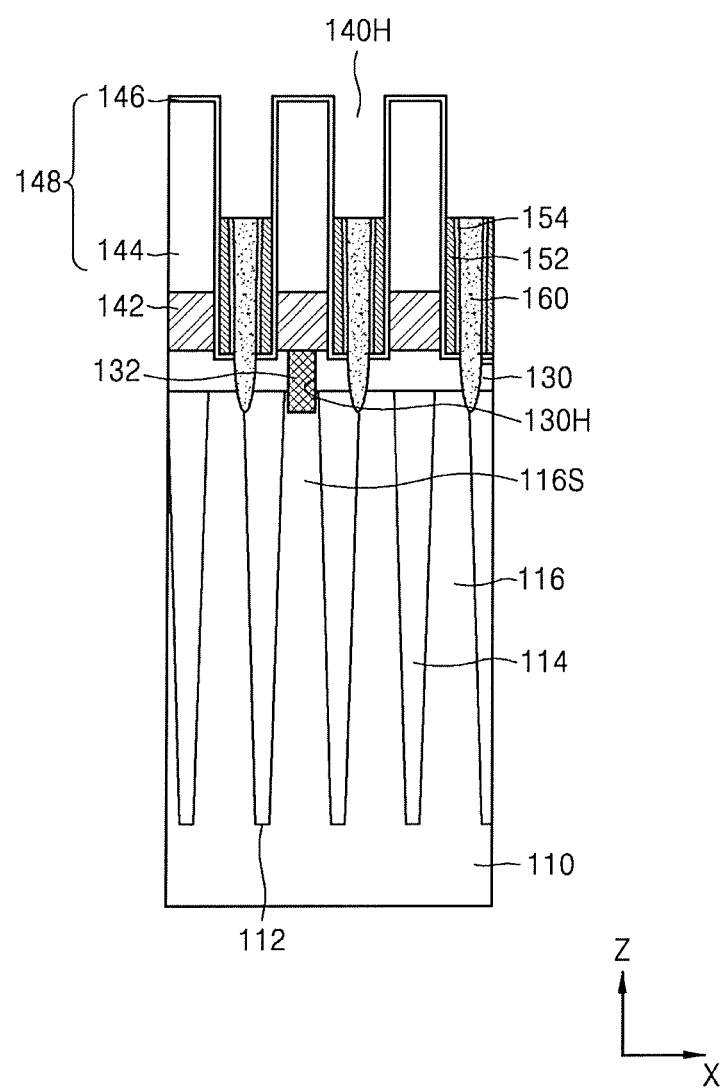
Figure 3B:
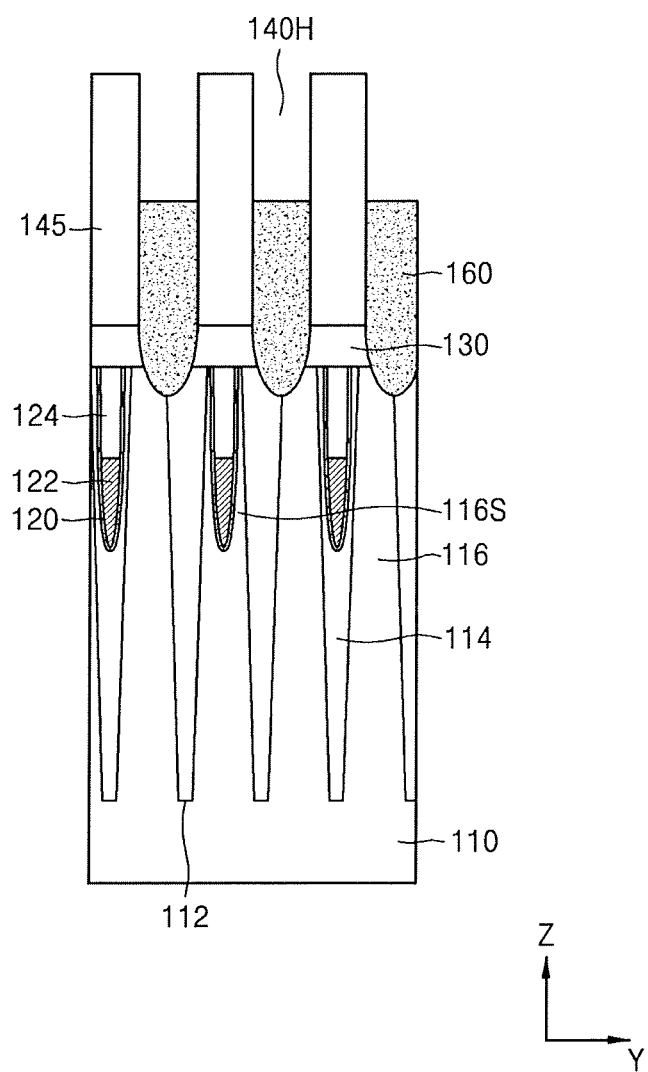

Referring to FIGS. 3A and 3B, a first contact plug 160 may be formed. The first contact plug 160 may fill a portion of the first contact hole 140H and may be electrically connected to a corresponding active area 116.

The substrate 110 (e.g., the active areas 116) may be exposed by removing a portion of each of the first spacer cover layer 154, the bit line cover layer 146, and the insulation layer pattern 130, which are disposed under the first contact hole 140H, from a bottom of the first contact hole 140H, thus forming the first contact plug 160. In some exemplary embodiments of the present inventive concept, a portion of the substrate 110 may be further removed.

In some exemplary embodiments of the present inventive concept, a metal silicide layer may be formed on a surface of the substrate 110 which is exposed in the bottom of the first contact hole 140H. For example, the metal silicide layer may include cobalt silicide. However, exemplary embodiments of the present inventive concept are not limited thereto, and the metal silicide layer may include various kinds of metal silicide, as desired.

In some exemplary embodiments of the present inventive concept, the following processes may be employed in forming the metal silicide layer. A metal layer may be deposited on a surface of the substrate 110 which is exposed in a bottom of each of a plurality of contact holes 140H, and then, a first rapid thermal silicidation (RTS) process may be performed. The first RTS process may be performed at a temperature of from about 450 degrees C. to about 550 degrees C. A metal layer which does not react with a Si atom in the first RTS process may be removed, and then, a second RTS process may be performed at a temperature (e.g., a temperature of from about 800 degrees C. to about 950 degrees C.) higher than that of the first RTS process, thus forming the metal silicide layer. When a Cobalt (Co) layer is formed as the metal layer, a cobalt silicide layer may be formed.

A first auxiliary conductive layer covering the substrate 110 may be formed to fill the first contact hole 140H including the bottom where the substrate 110 is exposed, and then, by removing a portion of the first auxiliary conductive layer through the etch back process, the other portion of the first auxiliary conductive layer may remain in only a lower portion of the first contact hole 140H, thus forming the first contact plug 160. In some exemplary embodiments of the present inventive concept, the first contact plug 160 may include a barrier layer having a Ti/TiN stacked structure and a plug material layer which is formed on the barrier layer and is formed of doped polysilicon, metal, metal silicide, metal nitride, or a combination thereof.

A top of the first contact plug 160 may have a level which is equal to or higher than that of a top of each of the bit lines 142, and may have a level lower than that of a top of the bit line mask layer 148.

A portion of the first sacrificial spacer 152 and a portion of the first spacer cover layer 154 above the top of the first contact plug 160 may be substantially simultaneously removed through the etch back process of forming the first contact plug 160. A process of removing the portion of the first sacrificial spacer 152 and the portion of the first spacer cover layer 154 above the top of the first contact plug 160 may be additionally performed after the first contact plug 160 is formed. In some exemplary embodiments of the present inventive concept, uppermost ends of the first sacrificial spacer 152, the first spacer cover layer 154, and the first contact plug 160 may be disposed at substantially a same level.

A partial upper portion of the bit line mask layer 148 and/or a partial upper portion of the fence layer 145 may be removed in a process of forming the first contact plug 160.

Figure 4A:
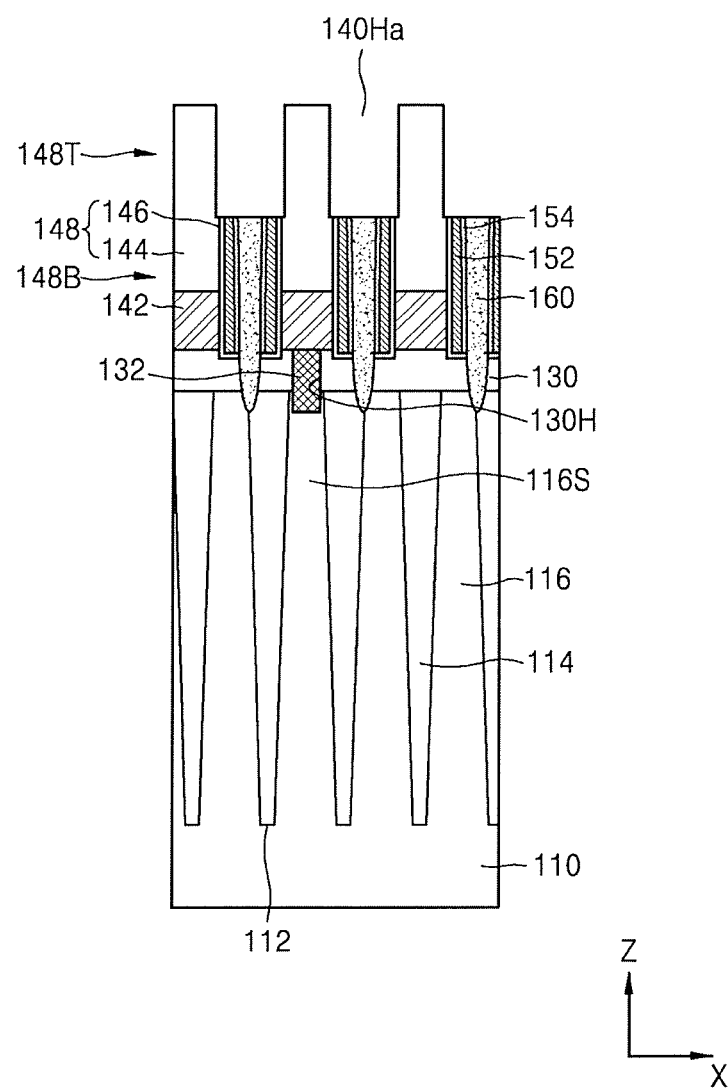
Figure 4B:
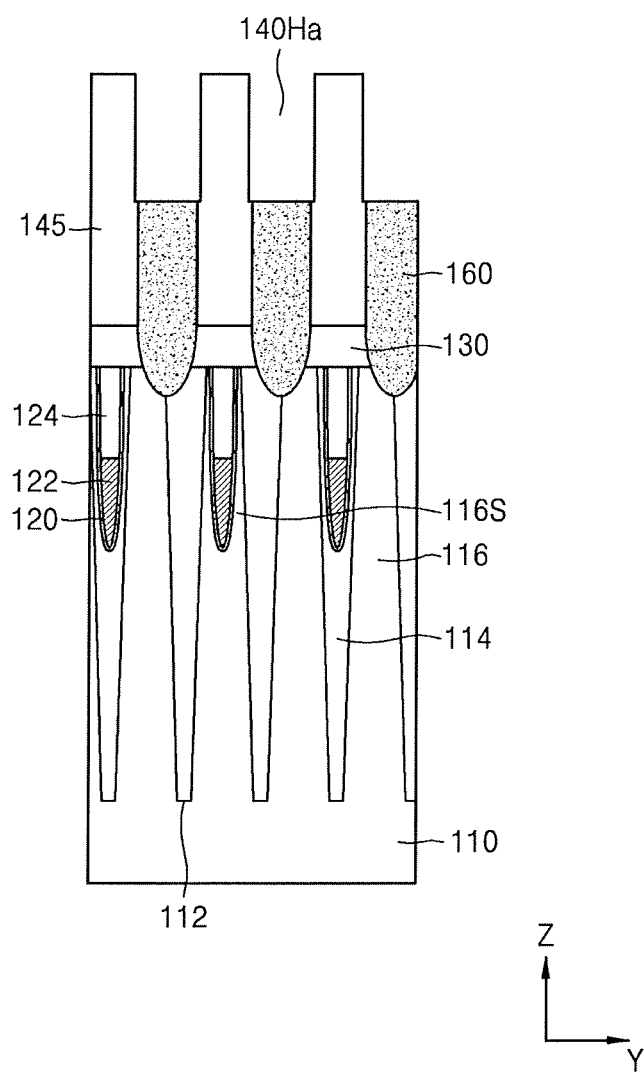

Referring to FIGS. 4A and 4B, a second contact hole 140Ha may be formed by removing a portion of the bit line mask layer 148 and a portion of the fence layer 145 from an exposed surface. The second contact hole 140Ha may be formed by extending a portion of the first contact hole 140H which is not filled by the first sacrificial spacer 152, the first spacer cover layer 154, and the first contact plug 160. Thus, the second contact hole 140Ha may have a width greater than that of first contact hole 140H. A wet etch process or a chemical dry etch process may be employed in forming the second contact hole 140Ha.

Since the second contact hole 140Ha is formed, an upper portion 148T of the bit line mask layer 148 and the fence layer 145 may have a width narrower than that of a lower portion 148B of the bit line mask layer 148. The bit line cover layer 146 may be substantially entirely removed from the upper portion 148T of the bit line mask layer 148 having a narrow width. The bit line cover layer 146 may be substantially entirely removed, and a portion of the insulation capping line 144 may be removed from the upper portion 148T of the bit line mask layer 148 having a relatively narrow width. For example, a relatively narrow width of the upper portion 148T of the bit line mask layer 148 may have a value which is equal to or less than that of a width of each of the bit lines 142.

The bit line mask layer 148, a boundary between the upper portion 148T and the lower portion 148B of the bit line mask layer 148 may have a level higher than that of the top of each of the bit lines 142 and the bit lines 142 are not exposed even when a portion of the bit line mask layer 148 is removed, and thus the width of the upper portion 148T may be narrowed.

Figure 5A:
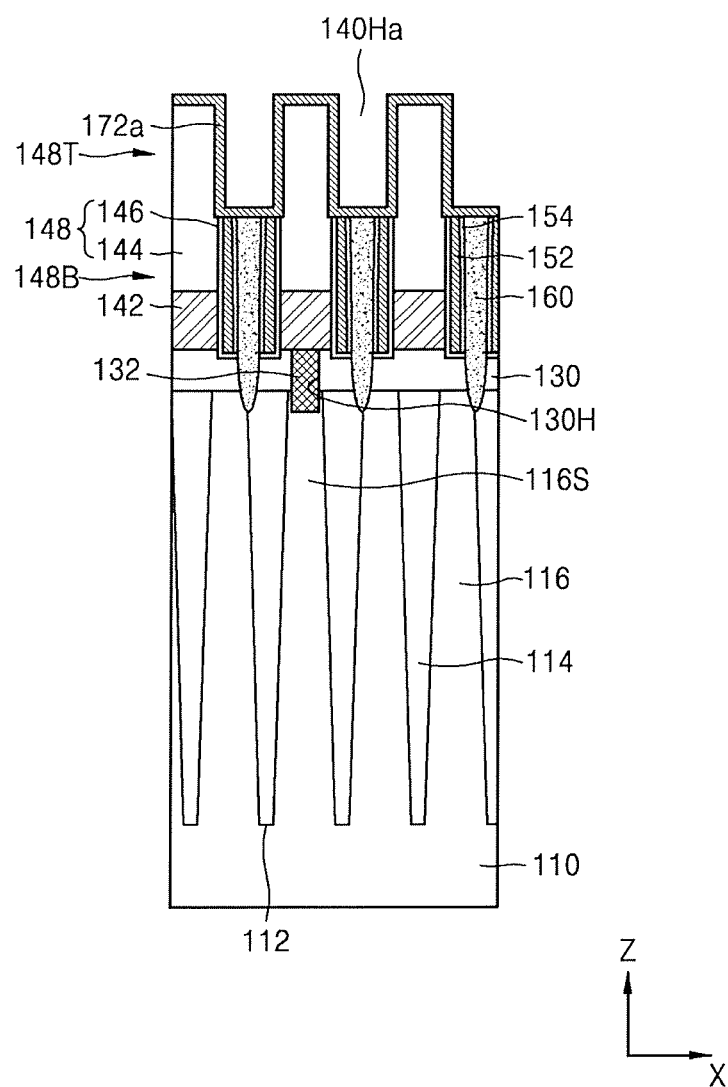
Figure 5B:
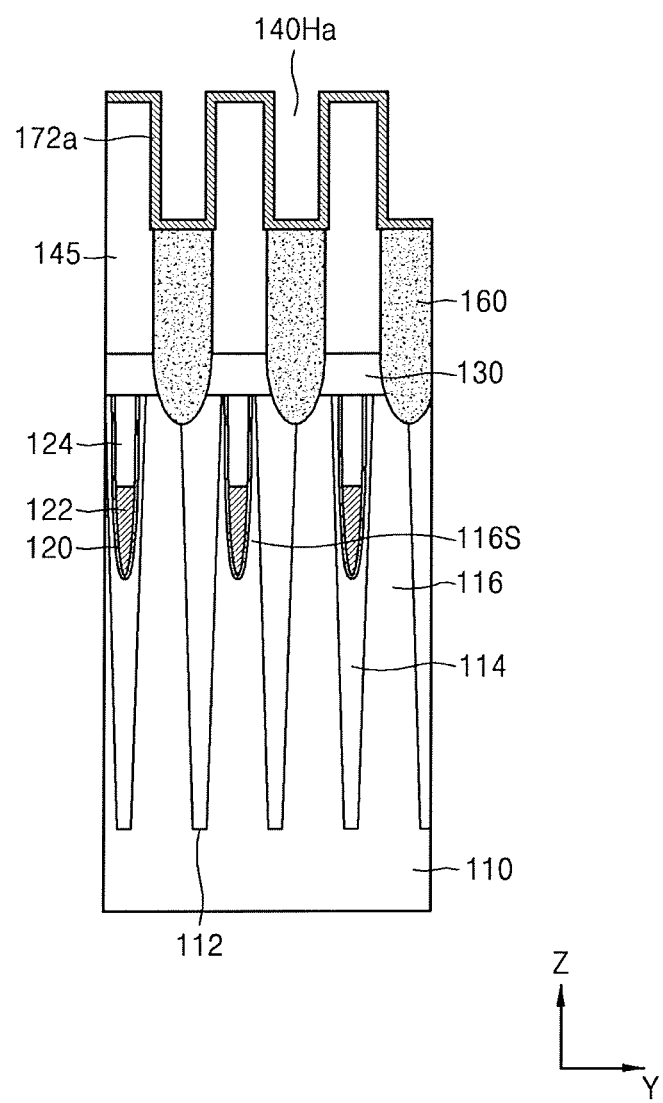

Referring to FIGS. 5A and 5B, a second auxiliary sacrificial spacer layer 172a which conformally covers the substrate 110 where the second contact hole 140Ha is formed may be formed. The second auxiliary sacrificial spacer layer 172a may cover an inner surface of the second contact hole 140Ha, but may be formed not to fill all of the second contact hole 140Ha. The second auxiliary sacrificial spacer layer 172a may include, for example, oxide, SiGe compounds, or a polymer. However, exemplary embodiments of the present inventive concept are not limited thereto.

A portion of the second auxiliary sacrificial spacer layer 172a which is formed on a side wall of each of the bit line mask layer 148 and the fence layer 145 may be formed to at least partially overlap the first sacrificial spacer 152 in a vertical direction (e.g., a Z direction) with respect to the main surface of the substrate 110. A thickness of the second auxiliary sacrificial spacer layer 172a may have a value greater than that of a thickness of each of the bit line mask layer 148 and the fence layer 145 which have been removed for forming the second contact hole 140Ha.

Figure 6A:
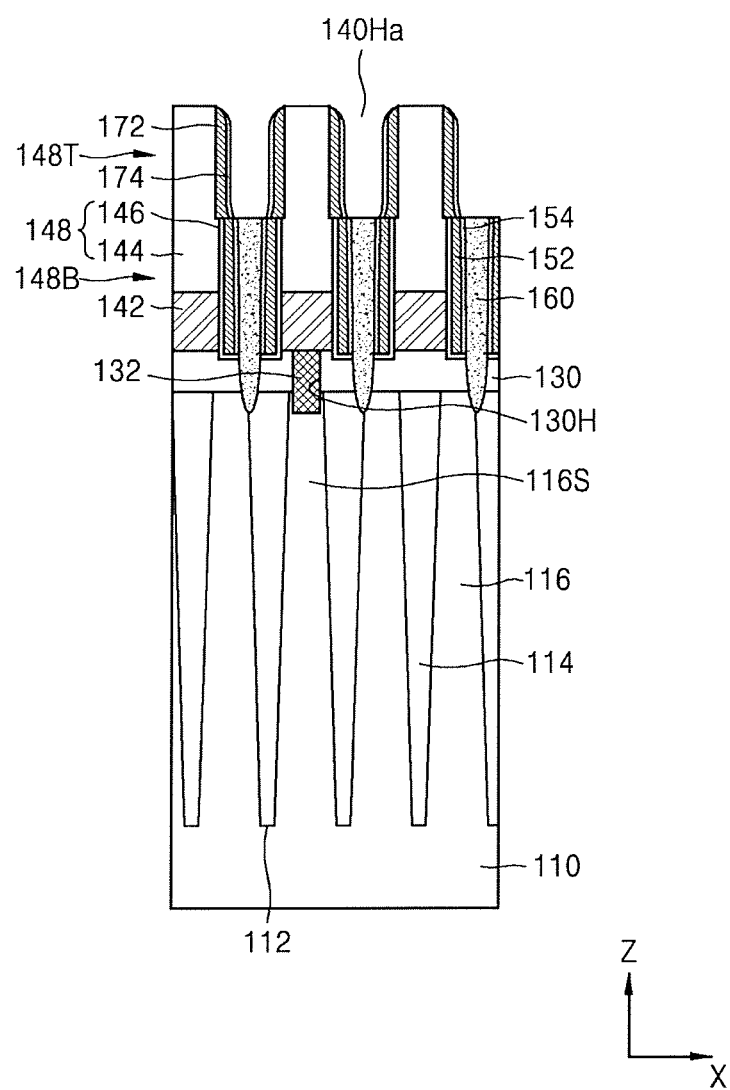
Figure 6B:
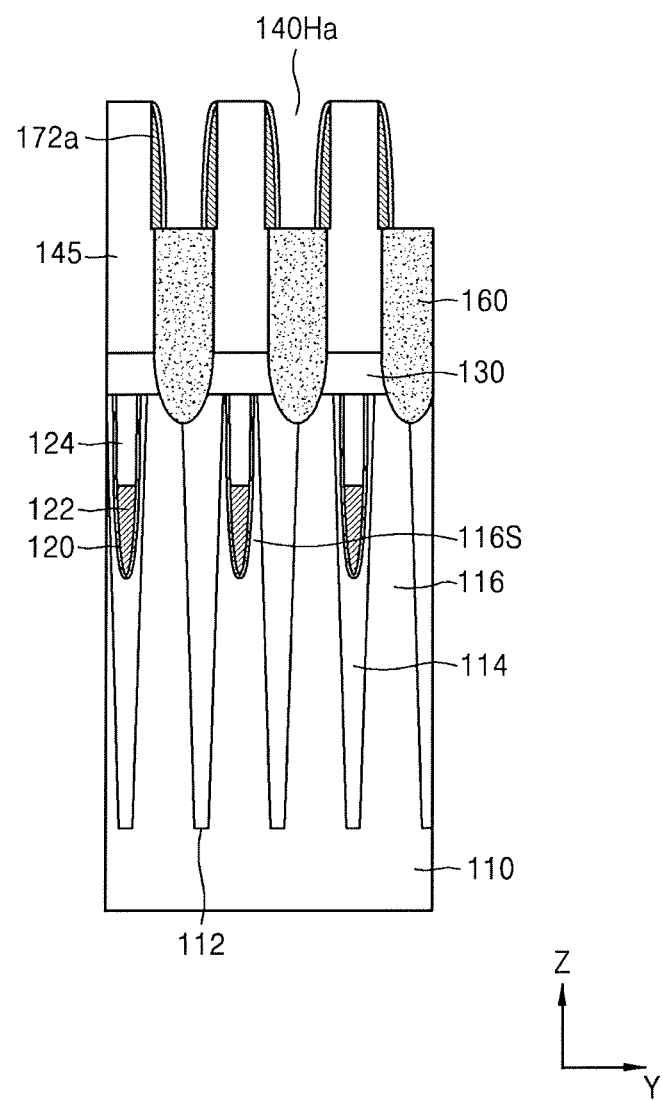

Referring to FIGS. 6A and 6B, a second sacrificial spacer 172 covering the side wall of each of the bit line mask layer 148 and the fence layer 145 may be formed by removing a portion of the second auxiliary sacrificial spacer layer 172a through the etch back process. The second sacrificial spacer 172 may expose a top of the bit line mask layer 148, a top of the fence layer 145, and a top of the first contact plug 160.

At least a portion of a bottom of the second sacrificial spacer 172 may contact at least a portion of the top of the first sacrificial spacer 152.

A second spacer cover layer 174 covering an exposed surface of the second sacrificial spacer 172 may be formed. An auxiliary spacer cover layer which conformally covers the substrate 110 on which the second sacrificial spacer 172 is formed may be formed, and then, the second spacer cover layer 174 may be formed by removing a portion of the auxiliary spacer cover layer through the etch back process.

Figure 7A:
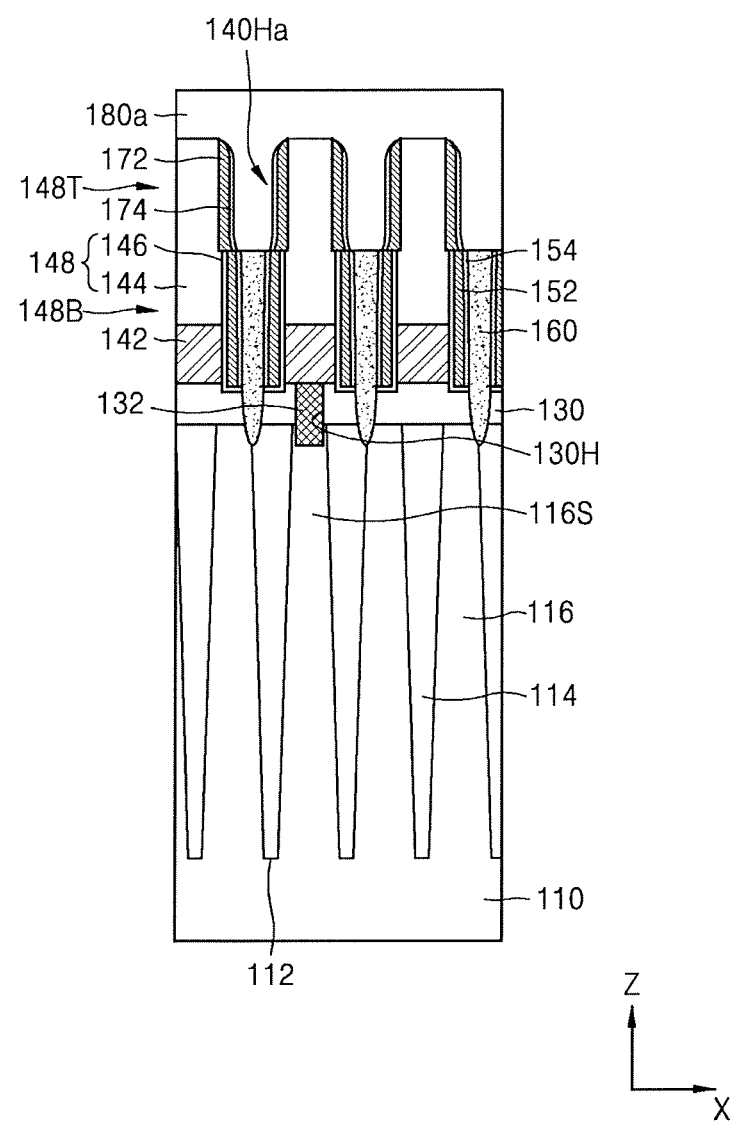
Figure 7B:
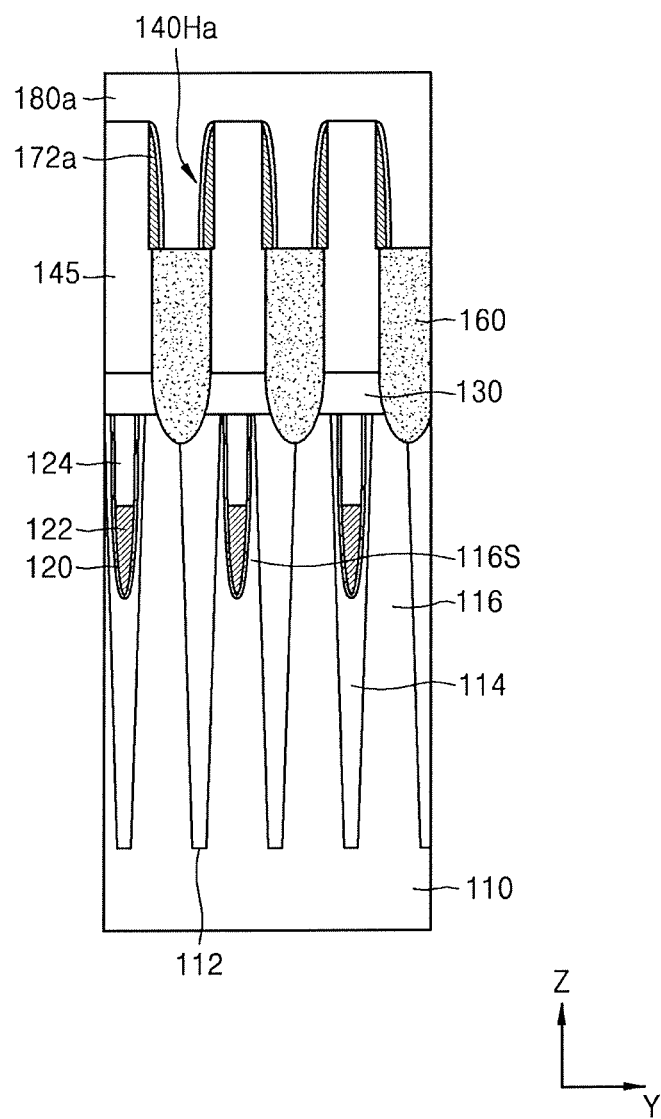

Referring to FIGS. 7A and 7B, a second auxiliary conductive layer 180a covering the substrate 110 may be formed to fill all of the second contact hole 140Ha. The second auxiliary conductive layer 180a may be formed to substantially entirely cover the top of the bit line mask layer 148 and a top of the fence layer 145. The second auxiliary conductive layer 180a may include metal, metal nitride, or a combination thereof.

In some exemplary embodiments of the present inventive concept, when the first contact plug 160 is formed of doped polysilicon, a metal silicide layer may be formed on an exposed surface of the first contact plug 160 before forming the second auxiliary conductive layer 180a. For example, the metal silicide layer may include cobalt silicide. However, exemplary embodiments of the present inventive concept are not limited thereto, and the metal silicide layer may include various kinds of metal silicide, as desired.

Figure 8A:
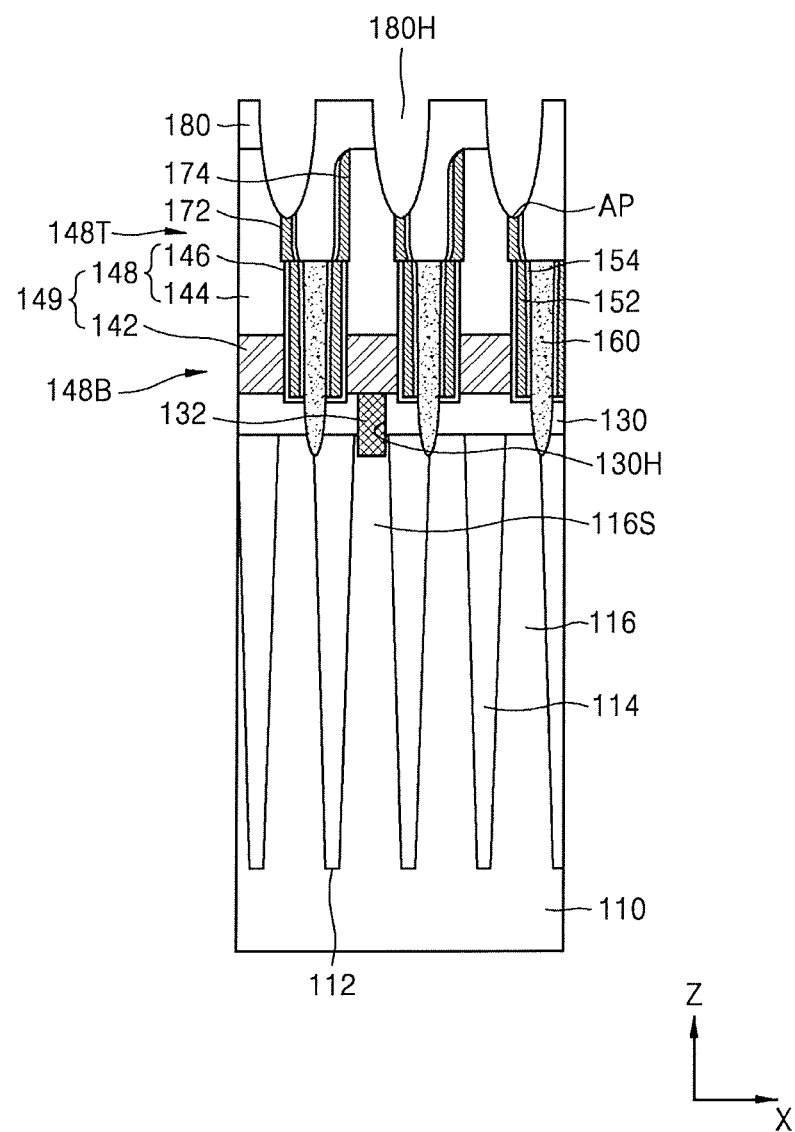
Figure 8B:
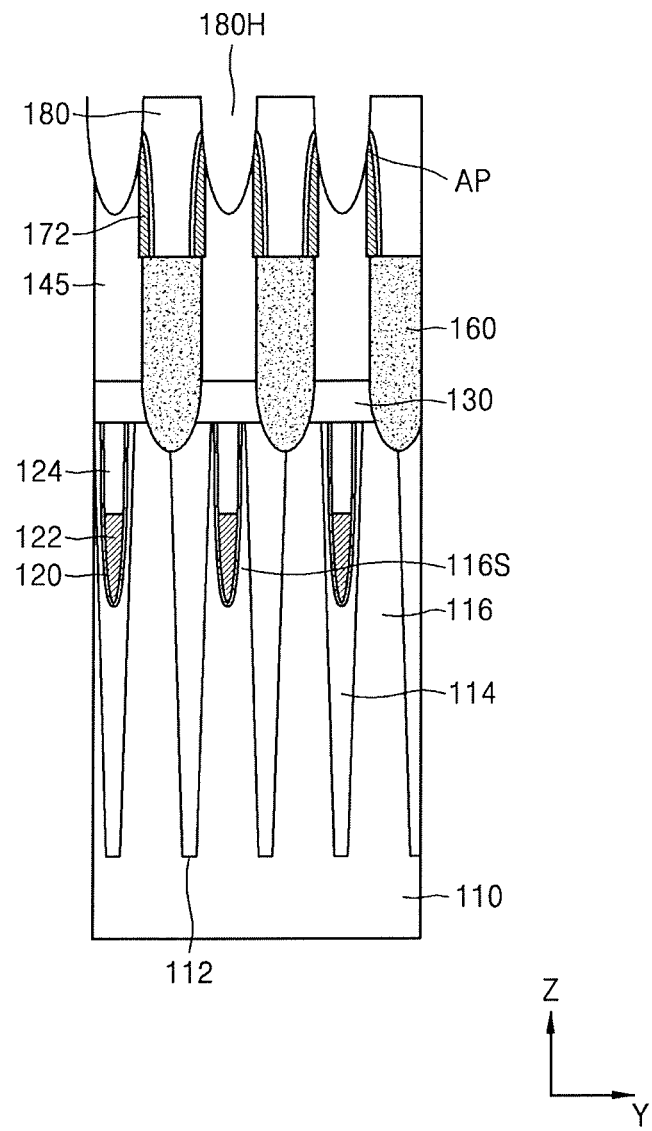

Referring to FIGS. 8A and 8B, a mask pattern may be formed on the second auxiliary conductive layer 180a. Subsequently, a plurality of second contact plugs 180 respectively connected to the plurality of first contact plugs 160 may be formed by etching the second auxiliary conductive layer 180a by using the mask pattern as an etch mask, and a plurality of upper spaces 180H exposing a portion of the second sacrificial spacer 172 may be formed by removing a portion of each of the bit line mask layer 148 and the second spacer cover layer 174 exposed through each of the second contact plugs 180. The plurality of second contact plugs 180 may be separated from each other by the plurality of upper spaces 180H.

The first contact plug 160 and the second contact plug 180 may each be referred to as a contact plug or a conductive pattern. The first contact plug 160 may be referred to as a first conductive pattern 160, and the second contact plug 180 may be referred to as a second conductive pattern 180. The bit line 142 and the bit line mask layer 148 surrounding the bit line 142 may be referred to as a bit line structure 149.

The first contact plug 160 may be disposed between adjacent bit line structures 149, and the second contact plug 180 may extend from between adjacent bit line structures 149 to a top of the bit line structure 149. The second contact plug 180 may be formed inside the second contact hole 140Ha and on the top of the bit line structure 149. The second contact hole 140Ha may have a width greater than that of the first contact hole 140H, and thus, a margin for connecting the second contact plug 180 to the first contact plug 160 may be secured despite the upper spaces 180H being formed.

In some exemplary embodiments of the present inventive concept, the plurality of mask patterns may have a rectangular shape, and the mask patterns may be separated from each other.

A partial upper portion of the second sacrificial spacer 172 may be removed in a process of forming the plurality of upper spaces 180H. A partial upper portion of the second sacrificial spacer 172 corresponding to each of the plurality of upper spaces 180H may be removed, and a partial upper portion of the second sacrificial spacer 172 under the second contact plug 180 need not be removed. Since the partially upper portion of the second sacrificial spacer 172 is removed, a surface of the second sacrificial spacer 172 exposed through each of the plurality of upper spaces 180H may become an air path AP.

Figure 9A:
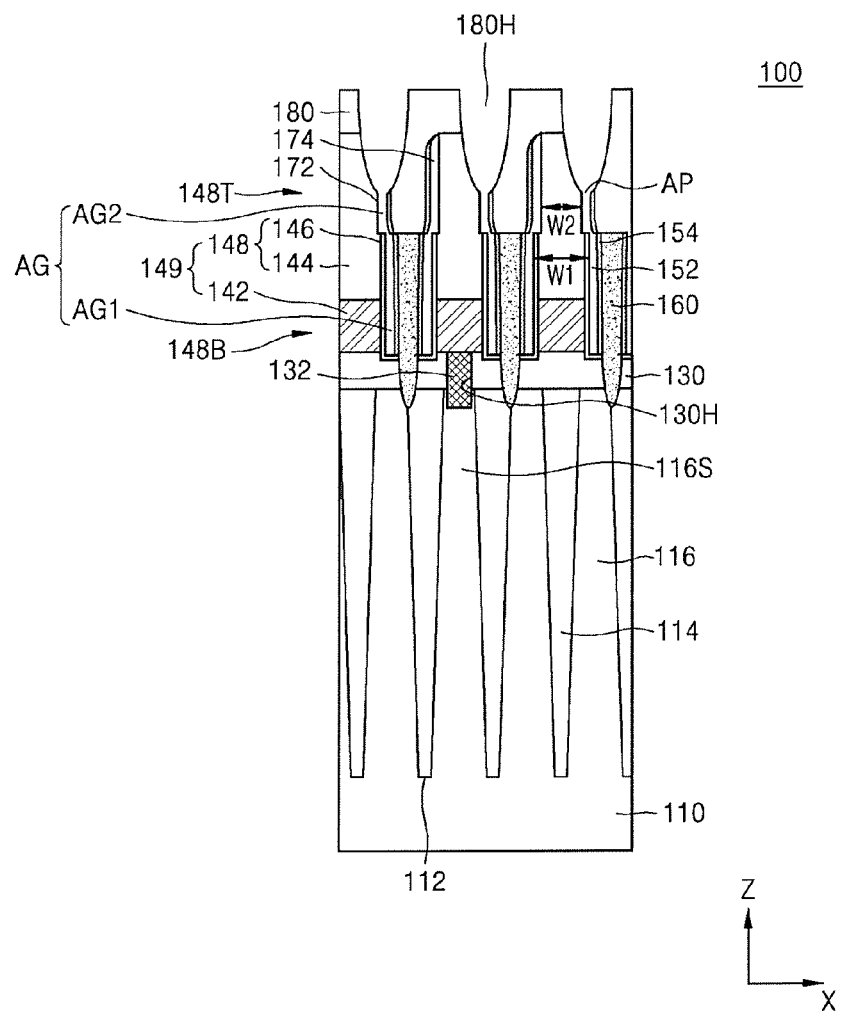
Figure 9B:
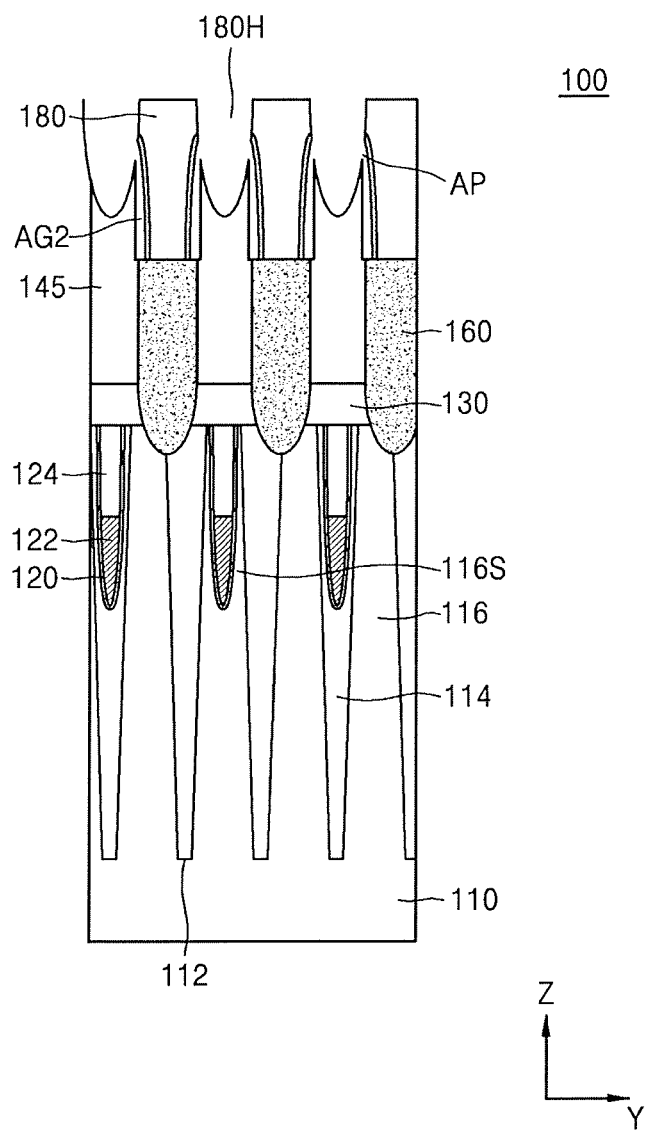

Referring to FIGS. 9A and 9B, a semiconductor device 100 including an air gap AG between the bit line structure 149 and the contact plugs 160 and 180 may be formed by removing the plurality of second sacrificial spacers 172 exposed through the plurality of upper spaces 180H. The air spacer AG may reduce or eliminate a parasitic capacitance between the bit line 142 and the contact plugs 160 and 180 which are included in the bit line structure 149.

A surface of the second sacrificial spacer 172 exposed through each of the plurality of upper spaces 180H may become the air path AP for forming the air gap AG. That is, the second sacrificial spacer 172 may be removed through the air path AP. The wet etch process or the chemical dry etch process may be used for removing the plurality of second sacrificial spacers 172.

Subsequently, a buried capping layer which fills the inside of each of the upper spacers 180H may be formed by depositing an insulating material on the substrate 110. The buried capping layer may fill a partial upper portion of the air spacer AG and may fill the air path AP. Thus, the air spacer AG isolated from the outside may be formed.

In some exemplary embodiments of the present inventive concept, a capacitor may be formed and may include a storage node connected to the second contact plug 180, a capacitor dielectric layer covering the storage node, and an upper electrode covering the capacitor dielectric layer.

The bit line structure 149 may include a lower portion having a first width W1 and an upper portion having a second width W2 less than the first width W1.

The bit line 142 may be buried inside the lower portion of the bit line structure 149, and a side and a top of the bit line 142 may be surrounded by the bit line mask layer 148. Thus, a portion (e.g., the lower portion 148B of the bit line mask layer 148) of the bit line mask layer 148 disposed in the lower portion of the bit line structure 149 may have the first width W1. The bit line 142 need not be disposed in the upper portion of the bit line structure 149, and the upper portion (e.g., the upper portion 148T of the bit line mask layer 148) of the bit line structure 149 may have the second width W2.

The lower portion 148T of the bit line mask layer 148 may include the bit line cover layer 146 and the insulation capping line 144 which are conformally formed on a side of each of the bit line 142 and the insulation capping line 144 having the substantially same width, and thus, the first width W1 of the lower portion 148B of the bit line mask layer 148 may have a substantially constant value. An upper end of the lower portion 148B of the bit line mask layer 148 having the first width W1 may have a level which is substantially the same as that of the top of the first contact plug 160.

The second width W2 of the upper portion 148T of the bit line mask layer 148 may have a value less than that of the first width W1 and may have a value which varies in at least a portion of the upper portion 148T of the bit line mask layer 148.

The air spacer AG may extend in the vertical direction (e.g., the Z direction) with respect to the main surface of the substrate 110 along a side wall of the lower portion 148B of the bit line mask layer 148 and may extend to a portion of a side wall of the upper portion 148T of the bit line mask layer 148. The air spacer AG may include a first air spacer AG1, which is disposed on a lower side, and a second air spacer AG2 which is disposed on an upper side and communicates with the first air spacer AG1. The first air spacer AG1 may be disposed on a side wall of the lower portion 148B of the bit line mask layer 148, and the second air spacer AG2 may be disposed on a side wall of the upper portion 148T of the bit line mask layer 148. In detail, the first air spacer AG1 may be disposed between the lower portion 148B of the bit line mask layer 148 and the contact plugs 160 and 180, and the second air spacer AG2 may be disposed between the upper portion 148T of the bit line mask layer 148 and the contact plugs 160 and 180. The first air spacer AG1 may be a portion of the air spacer AG having a level lower than that of the top of the first contact plug 160, and the second air spacer AG2 may be a portion of the air spacer AG having a level higher than that of the top of the first contact plug 160. An upper end of the first air spacer AG1 may have a level higher than that of the top of the bit line 142.

The air spacer AG disposed along a side wall of the bit line mask layer 148 may be formed in a space extending along a nonlinear path near a boundary (e.g., a portion where the first air spacer AG1 communicates with the second air spacer AG2) between the lower portion 148B and the upper portion 148T of the bit line mask layer 148, which may form a curve. In the air spacer AG, the first air spacer AG1 may extend along a side wall of the lower portion 148B of the bit line mask layer 148 in the vertical direction (e.g., the Z direction) with respect to the main surface of the substrate 110 and then may have a curve at a level of the top of the first contact plug 160, and the second air spacer AG2 may extend along a side wall of the upper portion 148T of the bit line mask layer 148.

The contact plugs 160 and 180 may include side walls which face two adjacent bit line structures 149 and have the air spacer AG between the side walls. The contact plugs 160 and 180 and the two adjacent bit line structures 149 may be referred to as a first bit line structure and a second bit line structure, and the bit line 142 and the bit line mask layer 148 included in each of the first and second bit line structures may be referred to as first and second bit lines and first and second bit line mask layers. The side walls of the contact plugs 160 and 180 respectively facing the first bit line and the second bit line may be referred to as a first side wall and a second side wall. A height of an air spacer AG, which is disposed between one side wall of the contact plugs 160 and 180 and a bit line structure 149 facing the one side wall and has the air spacer AP disposed between the side walls, may have a value less than that of a height of an air gap AG which is disposed between the other side wall of the contact plugs 160 and 180 and a bit line structure 149 facing the other side wall without the air spacer AP being disposed between the side walls and includes an upper end covered by the second contact plug 180. The first air spacer AG1 may have substantially a same height as each other. The second air spacers AG2 may have different heights from each other.

The air spacers AG disposed between the bit line structures 149 next to both sides of the contact plugs 160 and 180 may have a mutually asymmetrical shape. The first air spacers AG1 disposed between the bit line structures 149 next to the both sides of the contact plugs 160 and 180 may have a mutually symmetrical shape, and the second air spacers AG2 may have a mutually asymmetrical shape.

The contact plugs 160 and 180 may include side walls which face two adjacent fence layers 145 and have the second air spacer AG2 between the sidewalls. The second air gaps AG2 which are disposed between the fence layers 145 next to sides of the contact plugs 160 and 180 may each include the air path AP which is disposed in an upper portion of the second air spacer AG2, and thus may have a mutually symmetrical shape when the second air spacers AG2 have the same height as each other. The first air spacer AG1 need not be formed between the fence layers 145 next to the both sides of the contact plug 160 and 180.

Figure 10:
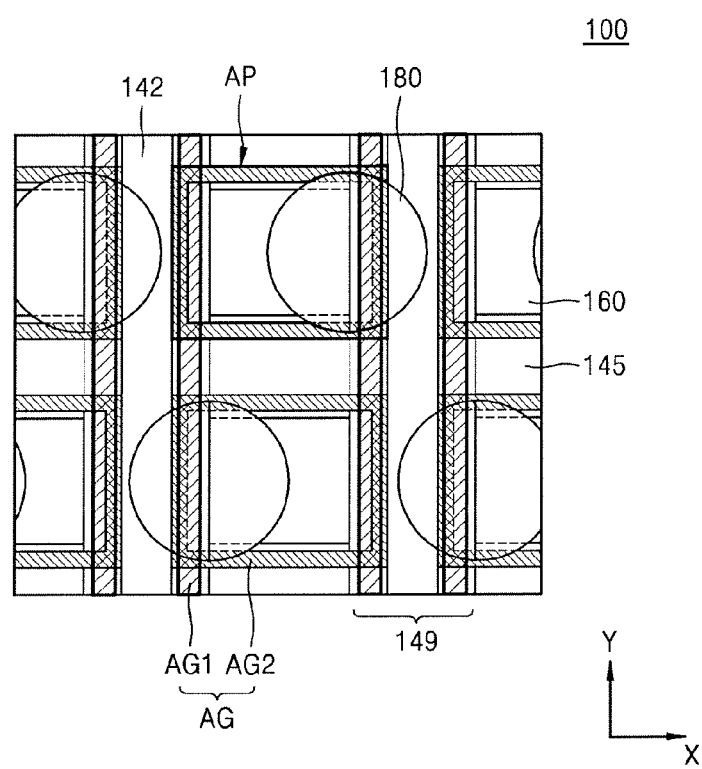
FIG. 10 is a plan view illustrating an air spacer and an air path for forming the air spacer, which may be included in a semiconductor device according to an exemplary embodiment of the present inventive concept.

FIG. 10 is a plan view illustrating an air spacer and an air path for forming the air spacer, which may be included in a semiconductor device according to an exemplary embodiment of the present inventive concept.

Referring to FIG. 10, a semiconductor device 100 may include a plurality of bit lines 142 which are spaced apart from each other and extend in parallel in a second direction (e.g., a Y direction), a plurality of fence layers 145 which are intermittently formed between the bit lines 142, and contact plugs 160 and 180. The air spacer AG may be formed between the bit line 142 and the contact plugs 160 and 180. The contact plugs 160 and 180 may include a first contact plug 160 and a second contact plug 180 connected to the first contact plug 180. The air spacer AG may include the first air spacer AG1 and the second air spacer AG2 which communicates with the first air spacer AG1.

The second contact plug 180 may include a bottom disposed between two adjacent bit lines 142 and a top which extends along a side and a top of one bit line structure 149 and has a level higher than that of the top of the bit line structure 149.

The bottom of the second contact plug 180 connected to a top of the first contact plug 160 may have a shape similar to that of the first contact plug 160. The top of the second contact plug 180 may have a circularly planar shape on the bit line structure 149. When a plurality of second contact plugs 180 are separated from each other, the plurality of second contact plugs 180 may have a rectangular shape. However, exemplary embodiments of the present invention are not limited thereto, and the contact plugs 160 and 180 may have other shapes, as desired.

The first air spacer AG1 may have a line shape which extends in the second direction (e.g., the Y direction) along both sides of the bit line 142. The second air spacer AG2 may surround a periphery of the contact plugs 160 and 180. The first air spacer AG1 and the second air spacer AG2 may communicate with each other through portions which planarly overlap each other. For example, the first air spacer AG1 and the second air spacer AG2 may communicate with each other at portions of the first and second air spacers AG1 and AG2, which overlap each other in a vertical direction with respect to a main surface of a substrate 110.

Referring to FIGS. 9A and 9B, the first air spacer AG1 may have a line shape which extends in the second direction (e.g., the Y direction) along the bit line structure 149 and the first contact plug 160, and the second air spacer AG2 may have a shape which surrounds a periphery of the contact plugs 160 and 180. The second air spacer AG2 may have, for example, a tetragonal border shape and may include a second contact plug 180. However, exemplary embodiments of the present invention are not limited thereto. The second air spacer AG2 may have a planar shape similar to a plane-shaped border of the second contact plug 180 disposed between adjacent bit line structures 149. That is, when a planar shape of a portion of the second contact plug 180 disposed between the adjacent bit line structures 149 is a tetragonal shape, a planar shape of the second air spacer AG2 may be a tetragonal border shape, and when a planar shape of a portion of the second contact plug 180 is a circular shape, a planar shape of the second air spacer AG2 may be an arc shape.

A plurality of the second air spacers AG2 disposed between adjacent bit line structures 149 may each communicate with two of the first air spacers AG1 extending in the second direction (e.g., the Y direction) between adjacent bit line structures 149.

The air path AP may be formed in a partial upper portion of the second air spacer AG2. The air path AP may be formed in a portion of the second air spacer AG2 exposed through an upper space 180H. Thus, the air path AP need not be formed in a portion where the second contact plug 180 covers an upper end of the second air spacer AG2. The air path AP need not be formed in a portion which overlaps the second air spacer AG2 in the vertical direction with respect to the main surface of the substrate 110. In some exemplary embodiments of the present inventive concept, the air path AP may have a U-shaped planar shape. For example, when a planar shape of the second air spacer AG2 is a tetragonal border shape, the air path AP may be formed in three sides of four tetragonal sides.

A plurality of the air paths AP may be intermittently formed along an extension direction of one first air spacer AG1. One air path of the plurality of air paths may overlap one first air spacer AG1 or two the first air spacers AG1 extending in the second direction (e.g., the Y direction) between adjacent bit line structures 149.

Referring to FIGS. 9A, 9B and 10, in the semiconductor device 100 according to an exemplary embodiments\ of the present inventive concept, even when the second contact hole 140Ha having a width greater than that of the first contact hole 140H is formed for securing a margin for connecting the second contact plug 180 to the first contact plug 160, the air path AP may be secured through the second air spacer AG2, thus securing a process margin and increasing device performance and reliability.

FIGS. 11 to 21 are cross-sectional views illustrating a method of manufacturing a semiconductor device according to an exemplary embodiment of the present inventive concept. FIGS. 11 to 21 are cross-sectional views corresponding to a cross-sectional surface extending along the first direction (e.g., the X direction) between two adjacent word lines WL in FIG. 1. In describing the embodiment of FIGS. 11 to 21, details repetitive of FIGS. 1 to 10 may be omitted, and like reference numerals may refer to like elements.

Figure 11:
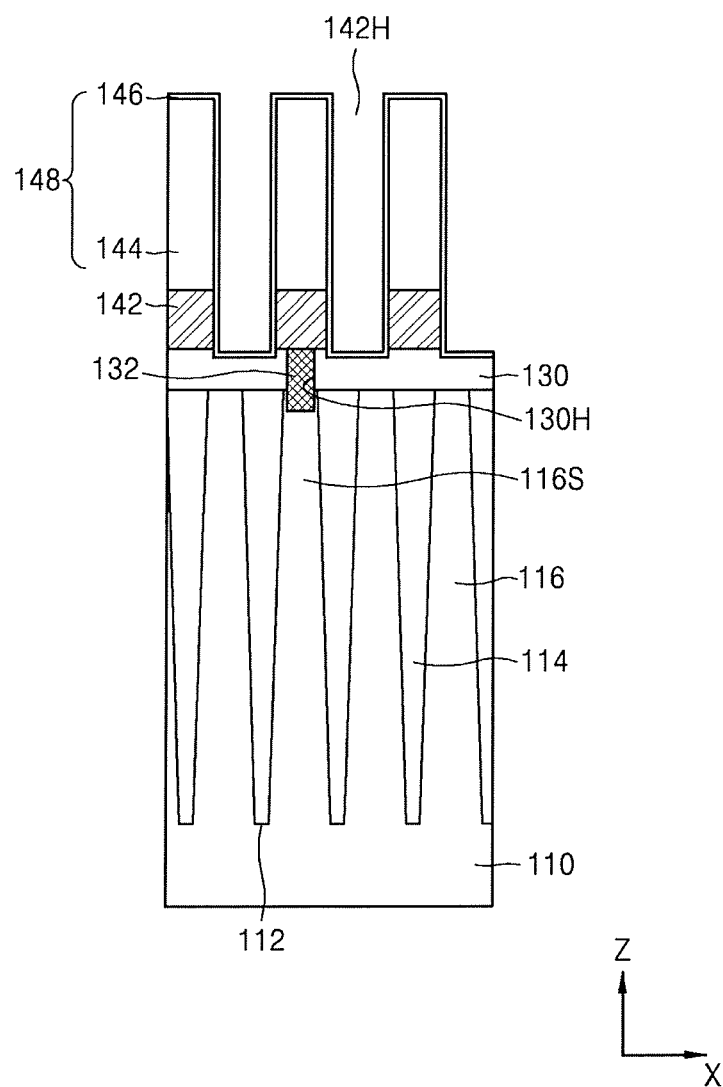
FIGS. 11 to 21 are cross-sectional views illustrating a method of manufacturing a semiconductor device according to an exemplary embodiment of the present inventive concept.

Referring to FIG. 11, the isolation layer 112 may be formed on a substrate 110, and a plurality of active areas 116 may be defined on the substrate 110 by the isolation layer 112. The plurality of active areas 116 may each have a substantially rectangular shape which has a short axis and a long axis. A source/drain area may be formed on the substrate 110 (e.g., a partial upper portion of each of the active areas 116).

The insulation layer pattern 130 including a plurality of openings 130H may be formed on the substrate 110. The plurality of openings 130H may expose a plurality of source areas 116S among the plurality of active areas 116.

A plurality of direct contacts 132 electrically connectable to the active area 110A may be formed by filling a conductive material into the plurality of openings 130H included in the insulation layer pattern 130. In a process of forming the insulation layer pattern 130 including the plurality of openings 130H, a portion of the substrate 110 exposed by each of the openings 130H may be removed, and the plurality of direct contacts 132 may extend to inside the substrate 110. A portion of the active area 116 contacting each of the direct contacts 132 may be source area 116S. One direct contact 132 of the plurality of direct contacts 132 may be electrically connected to one active area 116 of the plurality of active areas 116.

A plurality of bit lines 142, which are spaced apart from each other and extend in parallel with each other, may be formed on the insulation layer pattern 130 and the plurality of direct contacts 132. The plurality of bit lines 142 may be spaced apart from each other and extend in parallel with each other along the second direction (e.g., the Y direction). The plurality of bit lines 142 may each be electrically connected to a direct contact 132 of the plurality of direct contacts 132.

A plurality of insulation capping lines 144 which each cover a top of a bit line 142 of the plurality of bit lines 142 may be respectively formed on the bit lines 142. A thickness of each of the insulation capping lines 144 may be greater than that of each of the bit lines 142.

A bit line material layer and an insulation capping line material layer may be sequentially formed on the substrate 110, and then, the bit lines 142 and the insulation capping lines 144 may be formed by substantially simultaneously etching the bit line material layer and the insulation capping line material layer. Thus, the insulation capping lines 144 may be spaced apart from each other and extend in parallel with each other along the second direction (e.g., the Y direction), on the respective bit lines 142. A width of each of the insulation capping lines 144 in the first direction (e.g., the X direction) may be substantially the same as that of each of the bit lines 142 in the first direction (e.g., the X direction). In some exemplary embodiments of the present inventive concept, a portion of the insulation layer pattern 130 may be etched by over-etching the bit line material layer, and thus, a stepped portion may be formed in a top of the insulation layer pattern 130.

The bit line cover layer 146 may be formed on a side of each of the bit lines 142, a side of each of the insulation capping lines 144, and a top of each of the insulation capping lines 144. The insulation capping lines 144 and the bit line cover layer 146 may be referred to as the bit line mask layer 148 or the conductive line mask layer 148. The bit lines 142, the insulation capping lines 144, and the bit line cover layer 146 may be referred to as the bit line structure. A first space 142H which may be a rectangular-shaped space may be formed between adjacent bit line structures of a plurality of the bit line structures.

Figure 12:
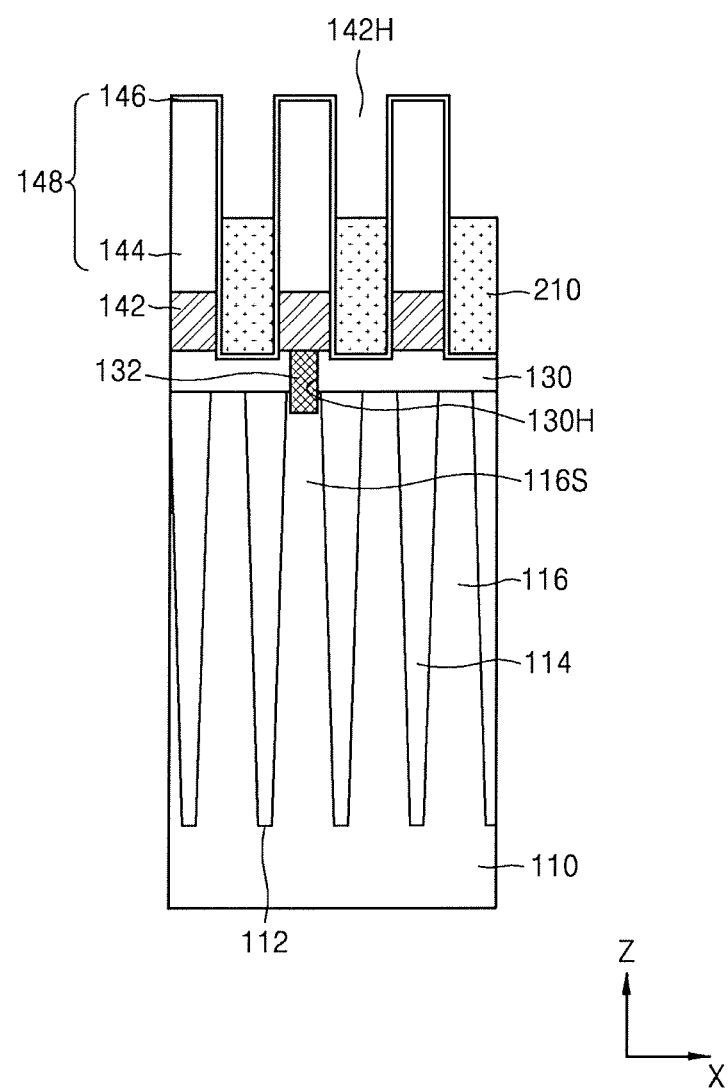

Referring to FIG. 12, a first mold layer 210 filling a partial lower portion of the first space 142H may be formed. The first mold layer 210 may include, for example, a material including carbon (C). The first mold layer 210 may be formed by coating, for example, an amorphous carbon layer (ACL) or a spin-on hardmark (SOH).

A top of the first mold layer 210 may be at a level which is equal to or higher than that of a top of each of the bit lines 142, or may be at a level which is lower than that of the top of each of the bit lines 142.

Figure 13:
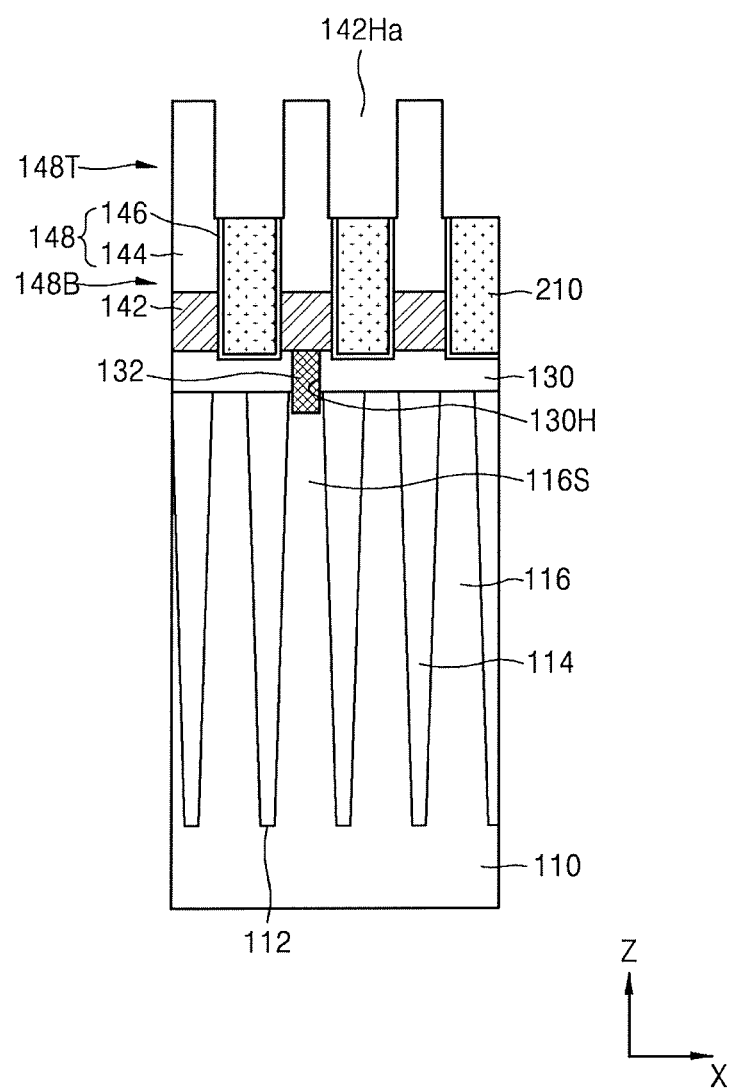

Referring to FIG. 13, a second space 142Ha may be formed by removing a portion of the bit line mask layer 148 from an exposed surface. The second space 142Ha may be formed by enlarging a portion of the first space 142H which is not filled by the first mold layer 210. Thus, the second space 142Ha may have a width greater than that of the first space 142H. The wet etch process or the chemical dry etch process may be performed for forming the second space 142Ha.

Since the second space 142Ha is formed, the upper portion 148T of the bit line mask layer 148 may have a width narrower than that of the lower portion 148B of the bit line mask layer 148. The bit line cover layer 146 may be substantially entirely removed from the upper portion 148T of the bit line mask layer 148 having a relatively narrow width. The bit line cover layer 146 may be substantially entirely removed, and a portion of the insulation capping line 144 may be further removed from the upper portion 148T of the bit line mask layer 148 having a relatively narrow width. For example, a relatively narrow width of the upper portion 148T of the bit line mask layer 148 having a relatively narrow width may have a value which is equal to or less than that of a width of each of the bit lines 142.

A boundary between the upper portion 148T and the lower portion 148B of the bit line mask layer 148 may have a level higher than that of the top of each of the bit lines 142 so that the bit lines 142 are not exposed even when a portion of the bit line mask layer 148 is removed, and thus the width of the upper portion 148T of the bit line mask layer 148 may be narrowed.

Figure 14:
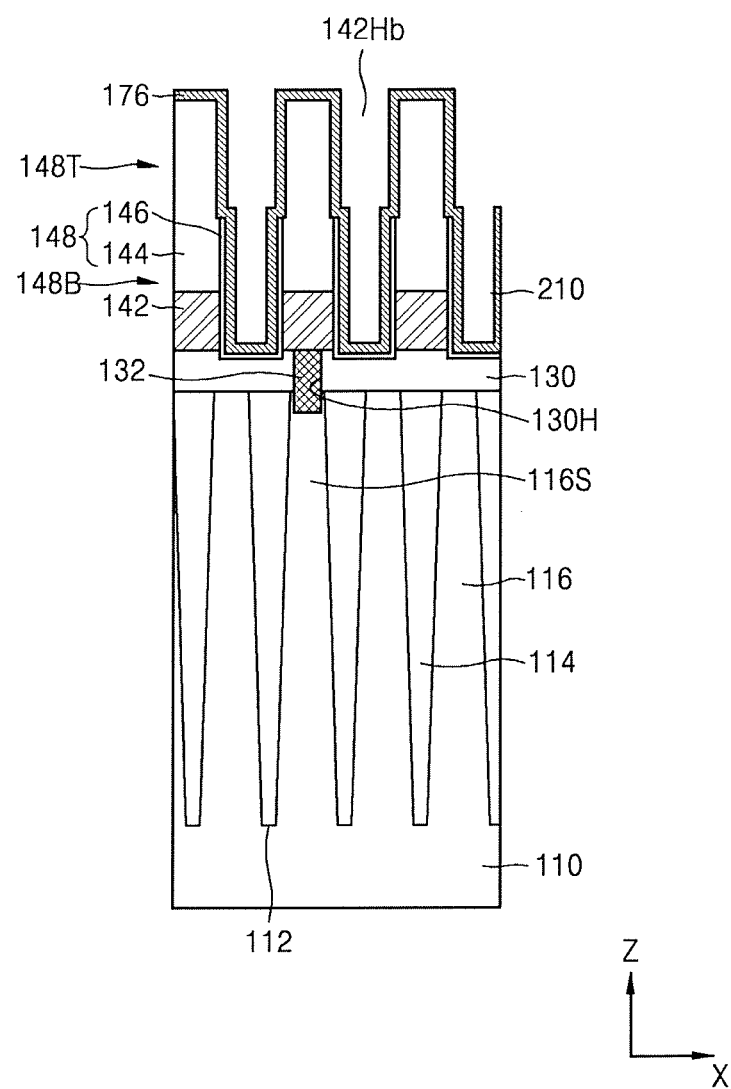

Referring to FIG. 14, a third space 142Hb through which a partially lower portion of the first space 142H filled by the first mold layer 210 communicates with the second space 142Ha may be formed by removing the first mold layer 210. The first mold layer 210 may be removed through an aching process. Since a width of the partially lower portion of the first space 142H may be narrower than that of the second space 142Ha, a lower space of the third space 142Hb may be relatively narrow, and an upper space of the third space 142Hb may be relatively wide.

Since a width of the upper portion 148T of the bit line mask layer 148 may be narrower than that of the lower portion 148B of the bit line mask layer 148, a width of an upper portion of the third space 142Hb disposed between two adjacent bit line mask layers 148 may be wider than that of a lower portion of the third space 142Hb.

A sacrificial spacer layer 176 which conformally covers the substrate 110 including the third space 142Hb may be formed. The sacrificial spacer layer 176 may cover an inner surface of the third space 142Hb, but may be formed not to fill all of the third space 142Hb. The sacrificial spacer layer 176 may include, for example, oxide, SiGe compounds, or a polymer. However, exemplary embodiments of the present inventive concept are not limited thereto.

Since a width of an upper portion of the third space 142Hb may be wider than that of a lower portion of the third space 142Hb, the sacrificial spacer layer 176 may extend along a nonlinear path near a boundary (e.g., near a portion where a width of the bit line mask layer 148 is narrowed) between the lower portion 148B and the upper portion 148T of the bit line mask layer 148 and may have a curve. A distance between a plurality of the sacrificial spacer layers 176 which are respectively formed on side walls of adjacent bit line mask layers 148 limiting one the third space 142Hb may further increase in the upper portion 148T of the bit line mask layer 148 than the lower portion 148B of the bit line mask layer 148.

Figure 15:
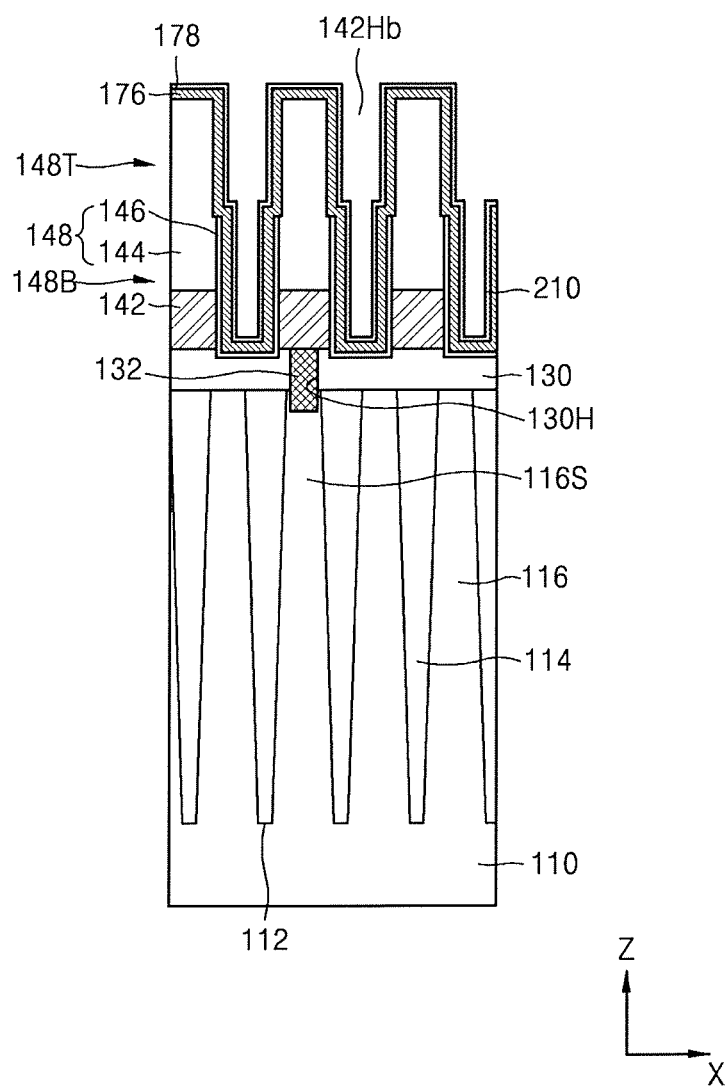

Referring to FIG. 15, a first spacer cover layer 178 conformally covering the substrate 110 on which the sacrificial spacer layer 176 is formed may be formed. The first spacer cover layer 178 may cover a surface of the sacrificial spacer layer 176 covering the inner surface of the third space 142Hb, but may be formed not to fill all of the third space 142Hb. The first spacer cover layer 178 may include, for example, silicon nitride, and/or silicon oxynitride. The first spacer cover layer 178 may have, for example, a thickness of from about 20 Å to about 100 Å.

Figure 16:
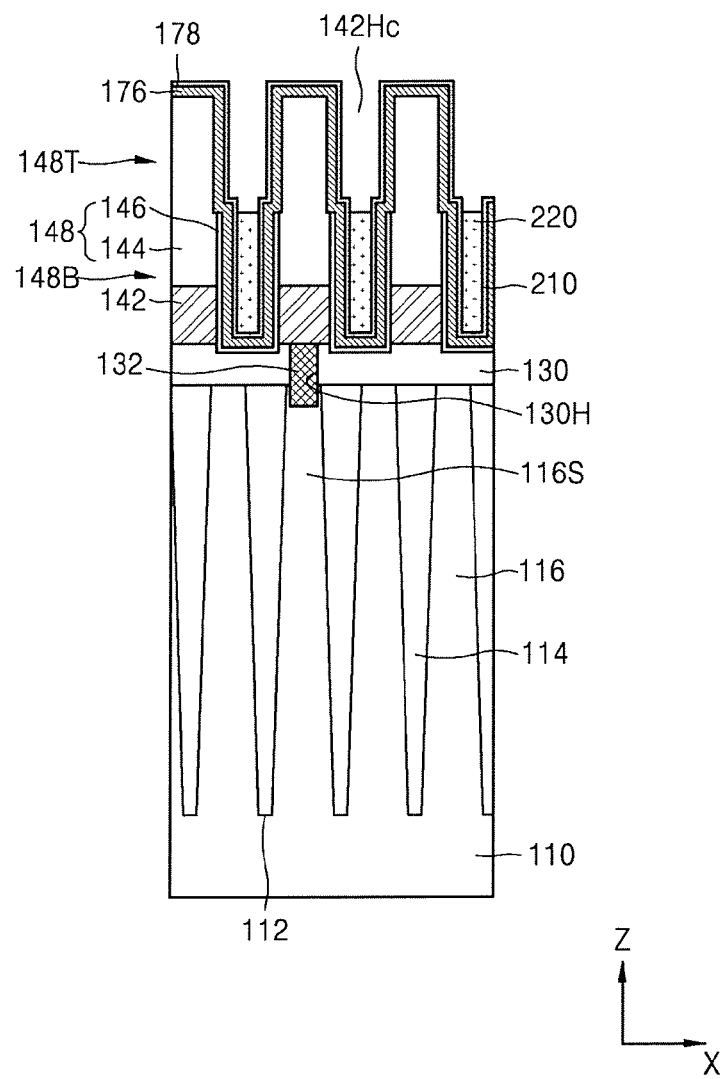

Referring to FIG. 16, a second mold layer 220 filling a partial lower portion of the third space 142Hb may be formed. The second mold layer 220 may include, for example, a material including carbon (C). The second mold layer 220 may be formed by coating, for example, an ACL or an SOH.

A top of the second mold layer 220 may have a level similar to that of a top of the lower portion 148B having a width wider than that of the upper portion 148T of the bit line mask layer 148. That is, the second mold layer 220 may fill the third space 142Hb from a bottom of the third space 142Hb to a level similar to that of a boundary where a width of the third space 142Hb is widened. A portion of the third space 142Hb which is not filled by the second mold layer 220 may be referred to as a fourth space 142Hc.

Figure 17:
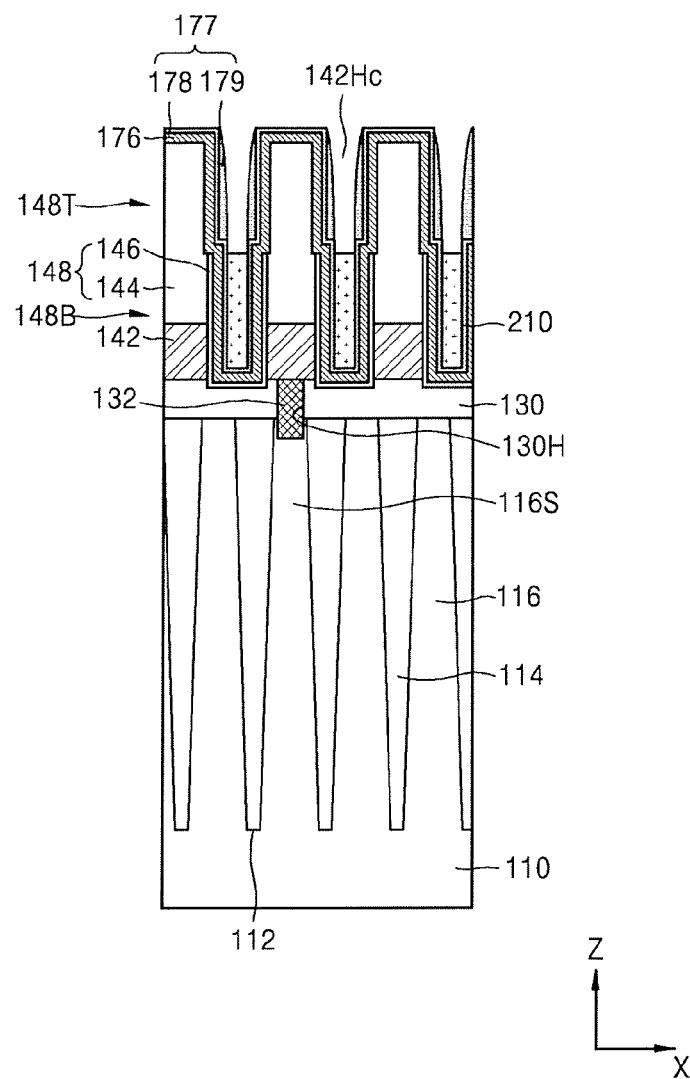

Referring to FIG. 17, a second spacer cover layer 179 covering a portion of the first spacer cover layer 178 formed on a side wall of the bit line mask layer 148 in the fourth space 142Hc may be formed. An auxiliary spacer cover layer, which conformally covers the substrate 110 on which the second mold layer 220 is formed, may be formed, and then, the second spacer cover layer 179 may be formed by removing a portion of the auxiliary spacer cover layer through an etch back process.

The second spacer cover layer 179 may mitigate a curve of the sacrificial spacer layer 176. That is, a spacer cover layer 177 which includes the first spacer cover layer 178 and the second spacer cover layer 179 may include a continuous surface in the fourth space 142Hc.

Figure 18:
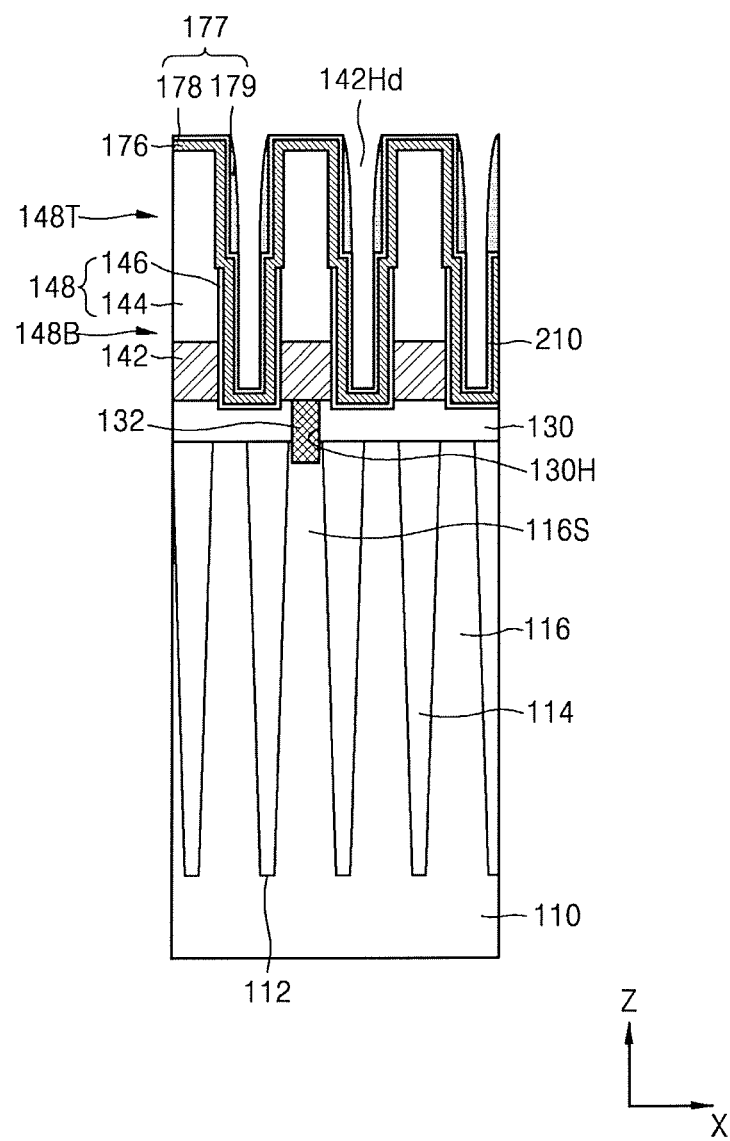

Referring to FIG. 18, by removing the second mold layer 220, a fifth space 142Hd may be formed between adjacent bit line mask layers 148. The second mold layer 220 may be removed through the ashing process.

Figure 19:
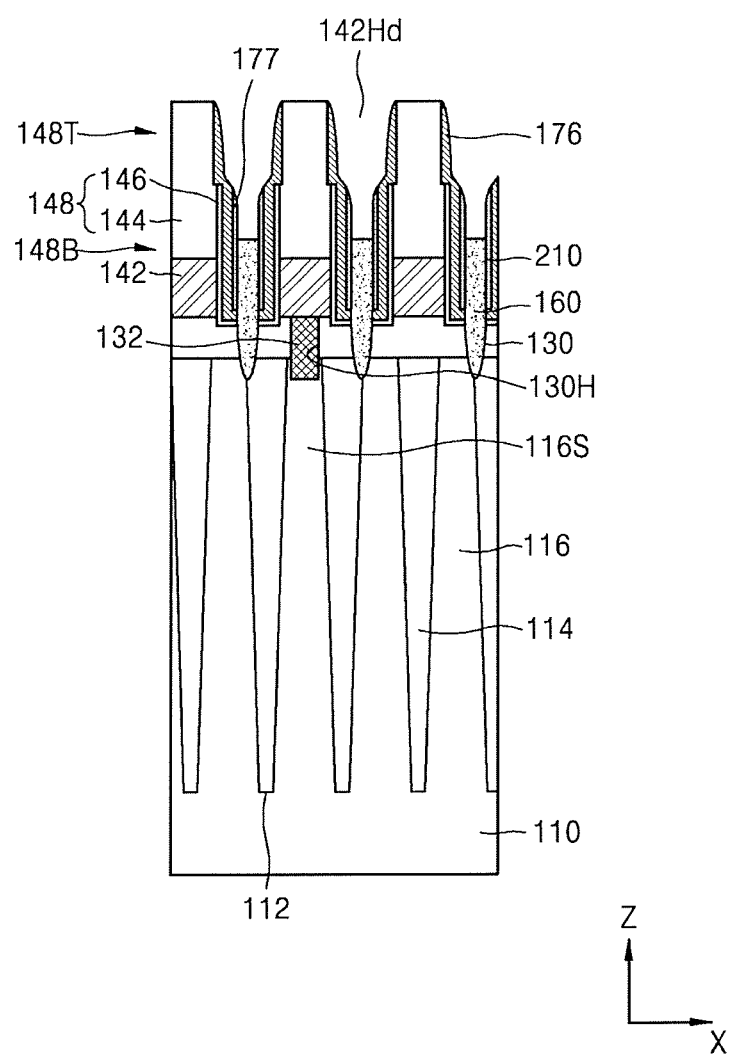

Referring to FIG. 19, the first contact plug 160 which fills a portion of the fifth space 142Hd and is electrically connected to the active area 116 may be formed.

An insulation layer filling the fifth space 142Hd may be formed for forming the first contact plug 160, and then, a plurality of mask layers which are spaced apart from each other and extend in parallel in a first direction (e.g., an X direction) may be formed on the substrate 110 on which the insulation layer is formed. Subsequently, a bottom of the fifth space 142Hd may be exposed by performing an etch process of removing a portion of the insulation layer by using the mask layer and the bit line mask layer 48 as an etch mask, and then, the substrate 110 (e.g., the active area 116) may be exposed by removing a portion of each of the first spacer cover layer 178, the sacrificial spacer layer 176, the bit line cover layer 146, and the insulation layer pattern 130 disposed under the first spacer cover layer 178, the sacrificial spacer layer 176, and the bit line cover layer 146. In some exemplary embodiments of the present inventive concept, a portion of the substrate 110 may be further removed.

In some exemplary embodiments of the present inventive concept, a metal silicide layer may be formed on a surface of the substrate 110 which is exposed in the bottom of the fifth space 142Hd. For example, the metal silicide layer may include cobalt silicide. However, exemplary embodiments of the present inventive concept are not limited thereto, and the metal silicide layer may include various kinds of metal silicide, as desired.

A first auxiliary conductive layer covering the substrate 110 may be formed to fill the fifth space 142Hd including the bottom where the substrate 110 is exposed, and then, by removing a portion of the first auxiliary conductive layer through the etch back process, the other portion of the first auxiliary conductive layer may remain in only a lower portion of the fifth space 142Hd, thus forming the first contact plug 160.

A top of the first contact plug 160 may have a level which is equal to or higher than that of a top of each of the bit lines 142, and may have a level lower than that of a top of the bit line mask layer 148. The top of the first contact plug 160 may have a level lower than that of an upper end of the lower portion 148B of the bit line mask layer 148 having a relatively large width.

A portion of the sacrificial spacer layer 176 and a portion of the spacer cover layer 177 above the top of the first contact plug 160 may be substantially simultaneously removed through an etch process and the etch back process for forming the first contact plug 160. Referring to FIG. 19, a whole portion of the second spacer cover layer 179 in the spacer cover layer 177 may be removed. However, exemplary embodiments of the present inventive concept are not limited thereto. In some exemplary embodiments of the present inventive concept, only a partial upper portion of the second spacer cover layer 179 may be removed.

An upper portion of the sacrificial spacer layer 176 may remain due to the second spacer cover layer 179 in the etch process and the etch back process for forming the first contact plug 160. The remaining upper portion of the sacrificial spacer layer 176 may serve as a sacrificial layer for forming a second air gap AGa2 which will be described in more detail below with reference to FIGS. 21 and 22.

A partial upper portion of the bit line mask layer 148 may be removed in a process of forming the first contact plug 160.

Figure 20:
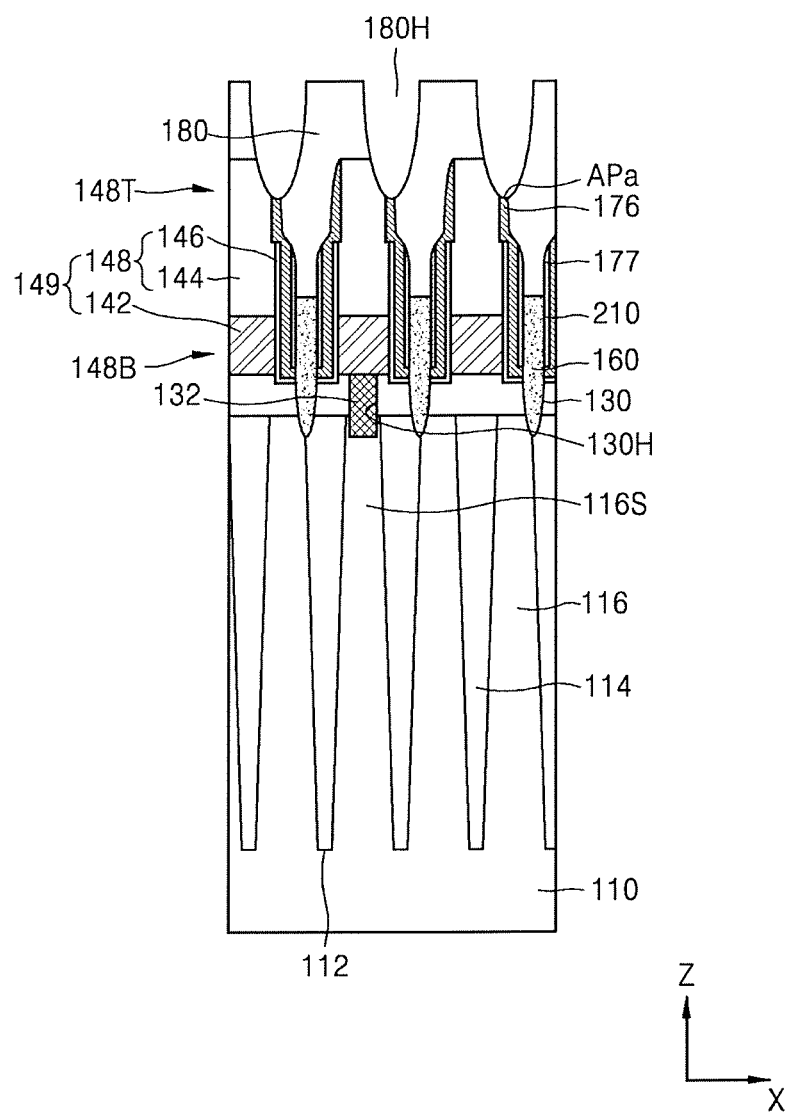

Referring to FIG. 20, a second auxiliary conductive layer (e.g., the second auxiliary conductive layer 180a) covering the substrate 110 may be formed to fill all of the fifth spacer 142Hd. The second auxiliary conductive layer may be formed to substantially entirely cover the top of the bit line mask layer 148.

In some exemplary embodiments of the present inventive concept, in a case where the first contact plug 160 includes doped polysilicon, a metal silicide layer may be formed on an exposed surface of the first contact plug 160 before forming the second auxiliary conductive layer. For example, the metal silicide layer may include cobalt silicide. However, exemplary embodiments of the present inventive concept are not limited thereto, and the metal silicide layer may include various kinds of metal silicide, as desired.

A mask pattern may be formed on the second auxiliary conductive layer. By etching the second auxiliary conductive layer by using the mask pattern as an etch mask, a plurality of second contact plugs 180 respectively connected to the plurality of first contact plugs 160 may be formed, and a plurality of upper spaces 180H exposing a portion of the sacrificial spacer layer 176 may be formed. In some exemplary embodiments of the present inventive concept, the plurality of mask patterns may each have a substantially rectangular shape and the mask patterns may be separated from each other.

A portion of the bit line mask layer 148 may be removed in a process of etching the second auxiliary conductive layer. The plurality of second contact plugs 180 may be separated from each other by a plurality of upper spaces 180H.

The first contact plug 160 and the second contact plug 180 may be referred to as the contact plugs 160 and 180. The bit line 142 and the bit line mask layer 148 surrounding the bit line 142 may be referred to as a bit line structure 149.

The first contact plug 160 may be disposed between adjacent bit line structures 149, and the second contact plug 180 may extend from between adjacent bit line structures 149 to a top of the bit line structure 149. The second contact plug 180 may be formed in the fifth space 142Hd and on the top of the bit line structure 149.

A partial upper portion of the sacrificial spacer layer 176 may be removed in a process of forming the plurality of upper spaces 180H. A partial upper portion of the sacrificial spacer layer 176 corresponding to each of the plurality of upper spaces 180H may be removed, and a partially upper portion of the sacrificial spacer layer 176 under the second contact plug 180 need not be removed. Since the partially upper portion of the sacrificial spacer layer 176 is removed, a surface of the sacrificial spacer layer 176 exposed through each of the plurality of upper spaces 180H may become the air path AP.

Figure 21:
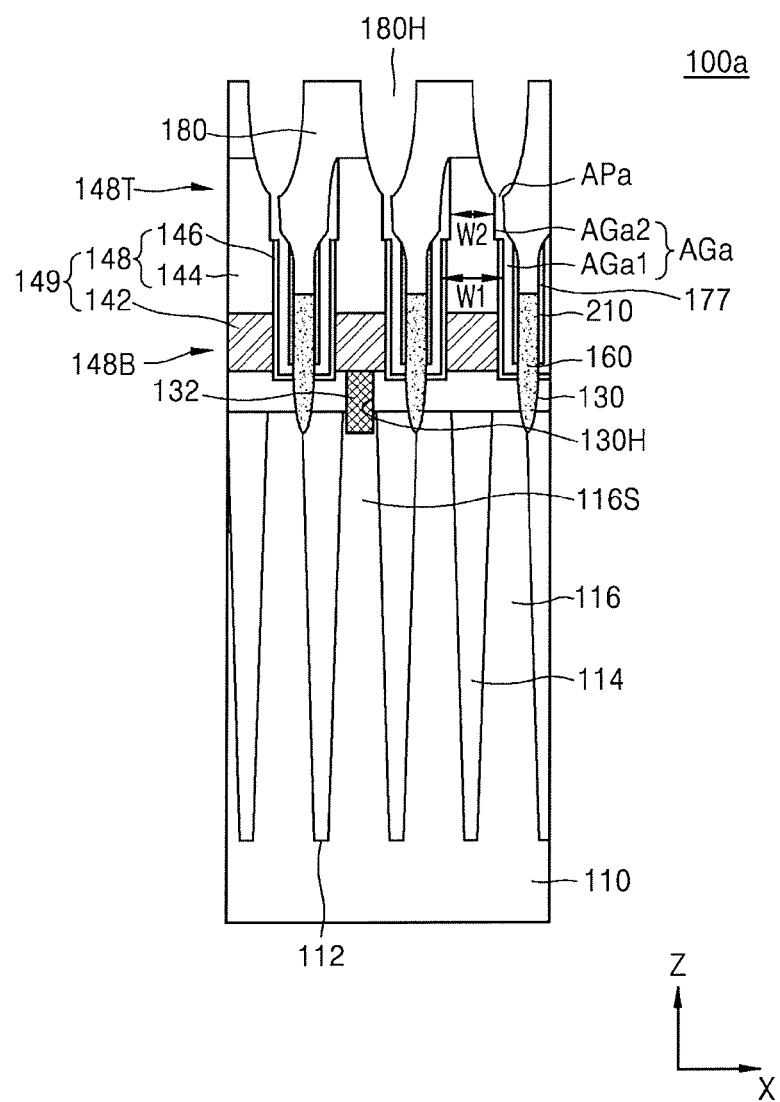

Referring to FIG. 21, a semiconductor device 100a including an air spacer AGa between the bit line structure 149 and the contact plugs 160 and 180 may be formed by removing a plurality of sacrificial spacer layers (176 exposed through the plurality of upper spaces 180H. The air spacer AGa may reduce or eliminate a parasitic capacitance between the bit line 142 and the contact plugs 160 and 180 which are included in the bit line structure 149.

A surface of the sacrificial spacer layer 176 exposed through each of the plurality of upper spaces 180H may become the air path APa for forming the air gap AGa. The sacrificial spacer 176 may be removed through the air path APa. The wet etch process or the chemical dry etch process may be used for removing the plurality of sacrificial spacer layers 176.

A buried capping layer which fills the inside of each of the upper spacers 180H may be formed by depositing an insulating material on the substrate 110. The buried capping layer may fill a partial upper portion of the air spacer AGa and may fill the air path APa. Thus, the air spacer AGa isolated from the outside may be formed.

In some exemplary embodiments of the present inventive concept, a capacitor may be formed and may include a storage node connected to the second contact plug 180, a capacitor dielectric layer covering the storage node, and an upper electrode covering the capacitor dielectric layer.

The bit line structure 149 may include a lower portion having a first width W1 and an upper portion having a second width W2 less than the first width W1.

The bit line 142 may be buried inside the lower portion of the bit line structure 149, and a side and a top of the bit line 142 may be surrounded by the bit line mask layer 148. Thus, a portion (e.g., the lower portion 148B of the bit line mask layer 148) of the bit line mask layer 148 disposed in the lower portion of the bit line structure 149 may have the first width W1. The bit line 142 need not be disposed in the upper portion of the bit line structure 149, and the upper portion (e.g., the upper portion 148T of the bit line mask layer 148) of the bit line structure 149 may have the second width W2.

The first width W1 of the lower portion 148B of the bit line mask layer 148 may have a substantially constant value. An upper end of the lower portion 148B of the bit line mask layer 148 having the first width W1 may have a level which is the same as that of the top of the first contact plug 160.

The second width W2 of the upper portion 148T of the bit line mask layer 148 may have a value less than that of the first width W1 and may have a value which varies in at least a portion of the upper portion 148T of the bit line mask layer 148.

The air spacer AGa may extend in a vertical direction (e.g., a Z direction) with respect to the main surface of the substrate 110 along a side wall of the lower portion 148B of the bit line mask layer 148 and may extend to a portion of a side wall of the upper portion 148T of the bit line mask layer 148. The air spacer AGa may include a first air spacer AGa1, which is disposed on a lower side of the bit line mask layer 148, and a second air spacer AGa2 which is disposed on an upper side of the bit line mask layer 148 and communicates with the first air spacer AGa1. The first air spacer AGa1 may be disposed between the lower portion 148B of the bit line mask layer 148 and the contact plugs 160 and 180, and the second air spacer AG2 may be disposed between the upper portion 148T of the bit line mask layer 148 and the contact plugs 160 and 180. An upper end of the first air spacer AGa1 may have a level which is equal to or higher than that of the top of the first contact plug 160. The upper end of the first air spacer AGa1 may have a level higher than that of the top of the bit line 142.

The air spacer AGa disposed along a side wall of the bit line mask layer 148 may be formed in a space extending along a nonlinear path near a boundary e.g., a portion where the first air spacer AGa1 communicates with the second air spacer AGa2) between the lower portion 148B and the upper portion 148T of the bit line mask layer 148. Thus, the air spacer Aga may have a curved shape. In the air spacer AGa, the first air spacer AGa1 may extend along a side wall of the lower portion 148B of the bit line mask layer 148 in the vertical direction (e.g., the Z direction) with respect to the main surface of the substrate 110 and then may be formed in the space extending along the nonlinear path at a level of the boundary between the lower portion 148B and the upper portion 148T of the bit line mask layer 148, and the second air spacer AGa2 may extend along a side wall of the upper portion 148T of the bit line mask layer 148.

The contact plugs 160 and 180 may include side walls which face two adjacent bit line structures 149 and have the air spacer AGa disposed between the side walls. A height of an air spacer AGa, which is disposed between one side wall of the contact plugs 160 and 180 and the bit line structure 149 facing the one side wall and has the air spacer APa disposed in an upper portion of the contact plugs 160 and 180, may have a value less than that of a height of an air spacer AGa which is disposed between the other side wall of the contact plug 160 and 180 and the bit line structure 149 facing the other side wall without the air spacer APa being disposed in an upper portion of the contact plugs 160 and 180. An upper end of the air spacer AGa which is disposed between the other side wall of the contact plug 160 and 180 and the bit line structure 149 may be covered by the second contact plug 180. The first air spacers AGa1 may each have substantially a same height as each other. A height of a portion of one second air spacer AGa2 having the air path APa may have a value less than that of a height of a portion of another second air spacer AGa2 not having on air path APa.

The first air spacers AGa1 disposed between the bit line structures 149 next to sides of the contact plugs 160 and 180 may have a mutually symmetrical shape, and the second air spacers AGa2 may have a mutually asymmetrical shape. Thus, the air spacers AGa disposed between the bit line structures 149 next to sides of the contact plugs 160 and 180 may have a mutually asymmetrical shape.

Figure 22:
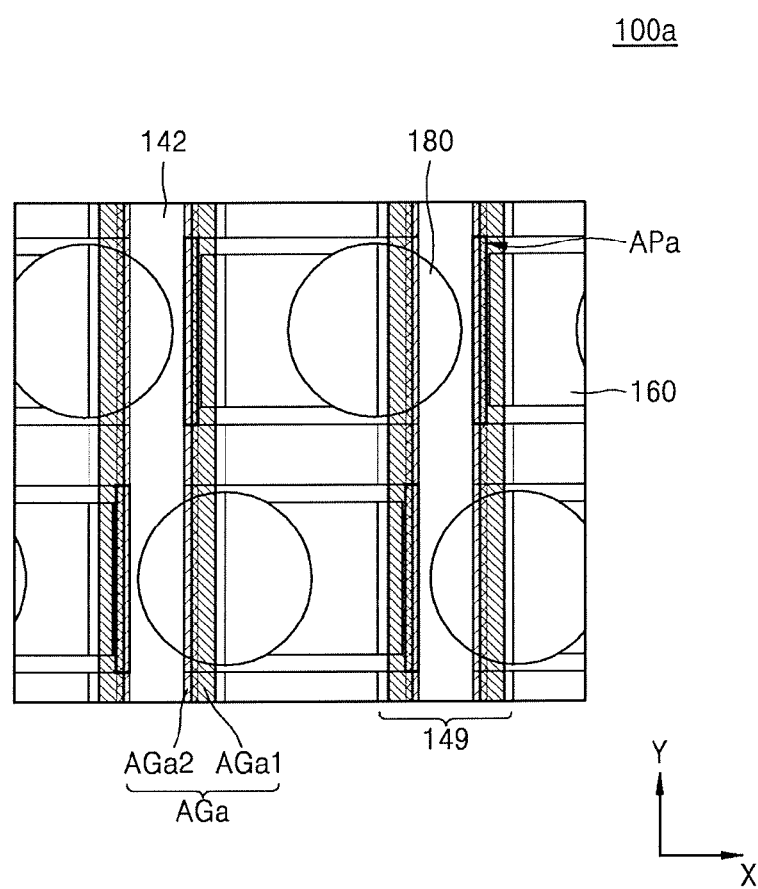
FIG. 22 is a plan disposition view illustrating an air spacer and an air path for forming the air spacer in a semiconductor device according to an exemplary embodiment of the present inventive concept.

FIG. 22 is a plan disposition view illustrating an air spacer and an air path for forming the air spacer in a semiconductor device according to an exemplary embodiment of the present inventive concept.

Referring to FIG. 22, the semiconductor device 100a may include a plurality of bit lines 142, which are spaced apart from each other and extend in parallel in a second direction (e.g., a Y direction), and the contact plugs 160 and 180. At least a portion of the contact plugs 160 and 180 may be disposed between two adjacent bit lines 142. The air spacer AGa may be formed between the bit line 142 and the contact plugs 160 and 180. The contact plugs 160 and 180 may include the first contact plug 160 and the second contact plug 180 connected to the first contact plug 180. The air spacer AGa may include the first air spacer AGa1 and the second air spacer AGa2 which communicates with the first air spacer AGa1. The first air spacer AGa1 may be disposed on a side wall of a lower portion 148B of a bit line mask layer 148, and the second air spacer AGa2 may be disposed on a side wall of an upper portion 148T of the bit line mask layer 148.

The second contact plug 180 may include a bottom disposed between two adjacent bit lines 142 and a top which extends along a side and a top of one bit line structure 149 and has a level higher than that of the top of the one bit line structure 149.

The bottom of the second contact plug 180 connected to a top of the first contact plug 180 may have a shape similar to that of the first contact plug 180. The top of the second contact plug 180 may have a circularly planar shape on one bit line structure 149. When a plurality of second contact plugs 180 are separated from each other, the plurality of second contact plugs 180 may have a rectangular shape. However, exemplary embodiments of the present invention are not limited thereto, and the contact plugs 160 and 180 may have other shapes, as desired.

The first air spacer AGa1 may have a line shape which extends in the second direction (e.g., the Y direction) along both sides of the bit line 142. The second air spacer AGa2 may have a line shape which extends in the second direction (e.g., the Y direction) along the both sides of the bit line 142.

Referring to FIGS. 21 and 22, the first air spacer AGa1 may have a line shape which extends in the second direction (e.g., the Y direction) along between the bit line structure 149 and the first contact plug 160, and the second air spacer AGa2 may have a line shape which extends in the second direction (e.g., the Y direction) along between the bit line structure 149 and the first contact plug 160. The second air spacer AGa2 may have a line shape where a portion of the second air spacer AGa2 overlaps the first air spacer AGa1, and the other portion of the second air spacer AGa2 extends in the second direction (e.g., the Y direction) without overlapping the first air spacer AGa1. In some exemplary embodiments of the present inventive concept, one of the first and second air spacers AGa1 and AGa2 may substantially entirely overlap the other one of the first and second air spacers AGa1 and AGa2. The first and second air spacers AGa1 and AGa2 may communicate with each other through a planarly overlapping portion of the first and second air spacers AGa1 and AGa2.

One the first air spacer AGa1 and one the second air spacer AGa2, having a line shape where at least a portion of the first air spacer AGa1 overlaps at least a portion of the second air spacer AGa2, may continuously communicate with each other along the second direction (e.g., the Y direction).

The air path APa may be formed in a partially upper portion of the second air spacer AGa2. The air path APa may be formed in a portion of the second air spacer AGa2 exposed through an upper space 180H. Thus, the air path APa need not be formed in a portion where the second contact plug 180 covers an upper end of the second air spacer AGa2. In some exemplary embodiments of the present inventive concept, the air path APa may be intermittently formed in the second air spacer AGa2.

Referring to FIGS. 21 and 22, in the semiconductor device 100a according to an exemplary embodiment of the present inventive concept, even when a width of an upper portion of the bit line structure 149 is relatively narrowly formed for securing a margin for connecting the second contact plug 180 to the first contact plug 160, the air path APa may be secured through the second air spacer AGa2, thus securing a process margin and increasing device performance and reliability.

Figure 23:
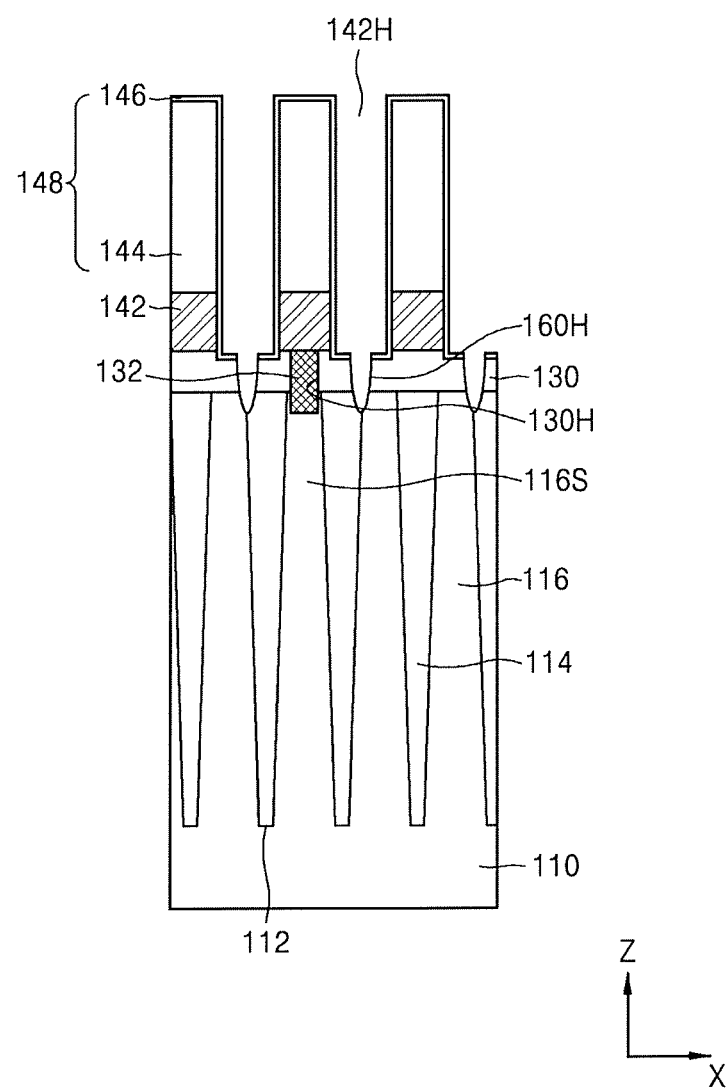
FIGS. 23 to 26 are cross-sectional views illustrating a method of manufacturing a semiconductor device according to an exemplary embodiment of the present inventive concept.

FIGS. 23 to 26 are cross-sectional views illustrating a method of manufacturing a semiconductor device according to an exemplary embodiment of the present inventive concept. In describing the embodiment of FIGS. 23 to 26, details repetitive of FIGS. 11 to 22 may be omitted, and like reference numerals may refer to like elements. FIG. 23 is a cross-sectional view illustrating a process subsequent to the process described with reference to FIG. 11.

Referring to FIG. 23, the substrate 110 (e.g., the active area 116) may be exposed by removing a portion of each of the bit line cover layer 146 and the insulation layer pattern 130 through a bottom of the first space 142H, and a contact hole 160H communicating with the first space 142H may be formed. In some exemplary embodiments of the present inventive concept, a portion of the substrate 110 may be further removed.

In some exemplary embodiments of the present inventive concept, a metal silicide layer may be formed on a surface of the substrate 110 which is exposed in the bottom of the contact hole 160H. For example, the metal silicide layer may include cobalt silicide. However, exemplary embodiments of the present inventive concept are not limited thereto, and the metal silicide layer may include various kinds of metal silicide, as desired.

Figure 24:
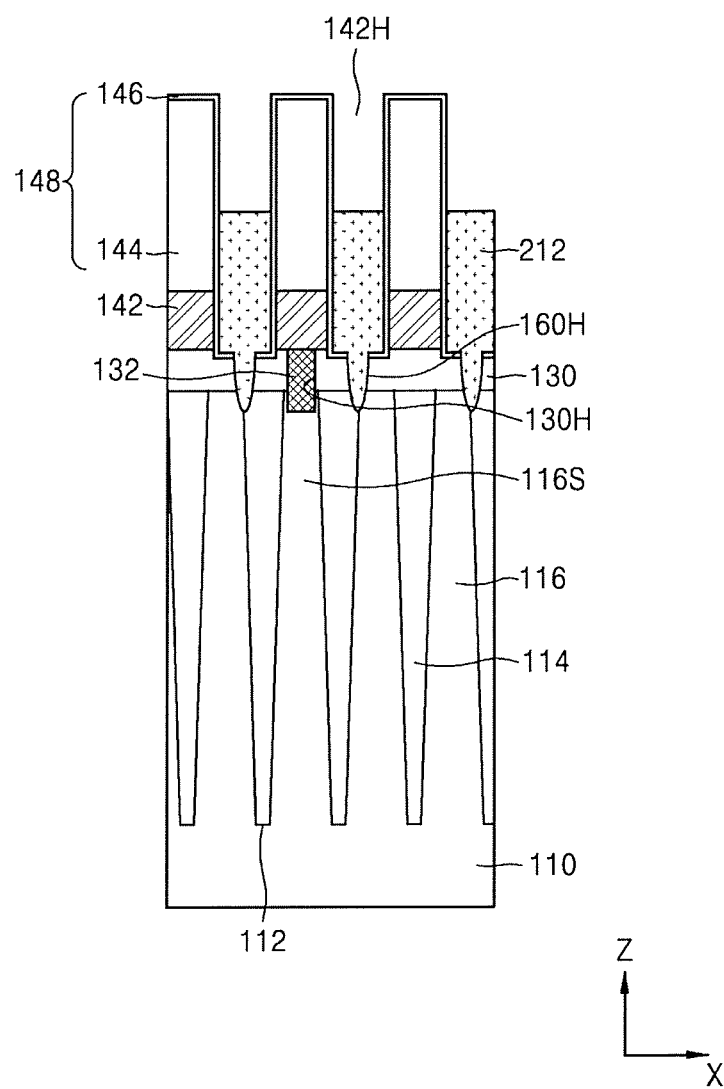

Referring to FIG. 24, a first mold layer 212 which fills a partial lower portion of the first space 142H and the contact hole 160H may be formed. The first mold layer 212 may include, for example, a material including carbon (C).

A top of the first mold layer 212 may have a level which is equal to or higher than that of a top of a bit line 142, or may have a level which is lower than that of a top of a bit line mask layer 148.

Figure 25:
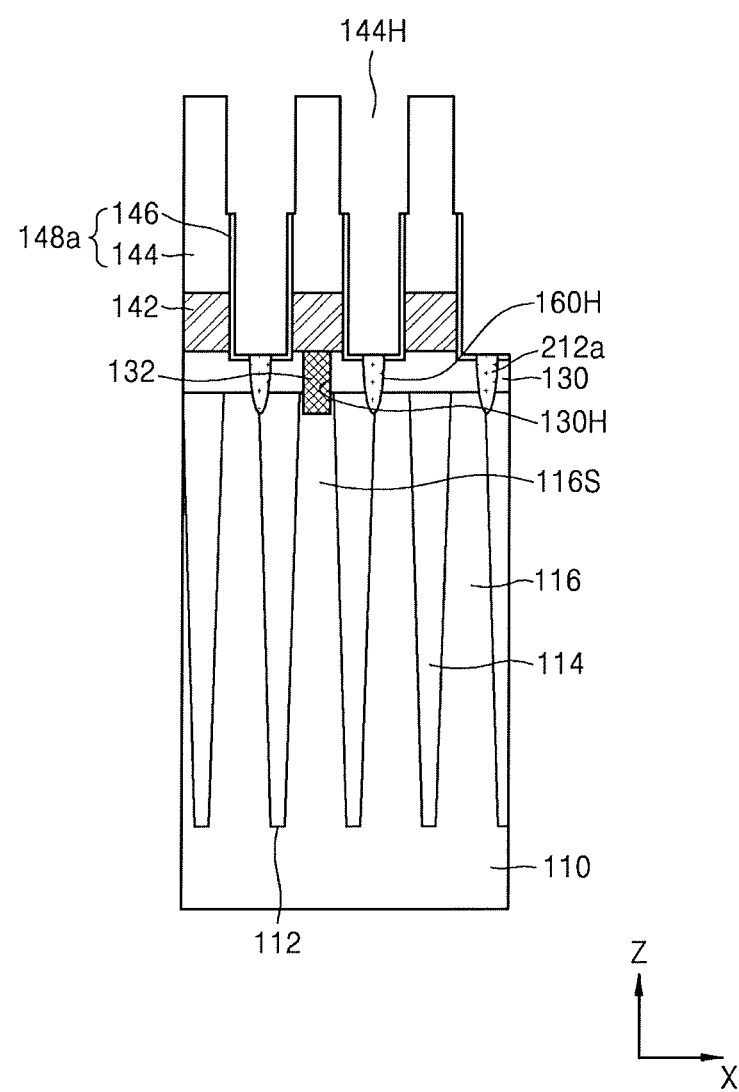

Referring to FIG. 25, by removing a portion of the bit line mask layer 148 through a surface exposed from the first mold layer 212 to form a bit line mask layer 148a, an upper portion 148T of the bit line mask layer 148a may have a width narrower than that of a lower portion 148B of the bit line mask layer 148a. A second space 144H may be formed by removing a portion of the first mold layer 212 so that a remaining mold layer 212a, which is a portion of the first mold layer 212 filling the contact hole 160H, is left. A width of a lower space of the second space 144H may be relatively narrow, and a width of an upper space of the second space 144H may be relatively wide.

Figure 26:
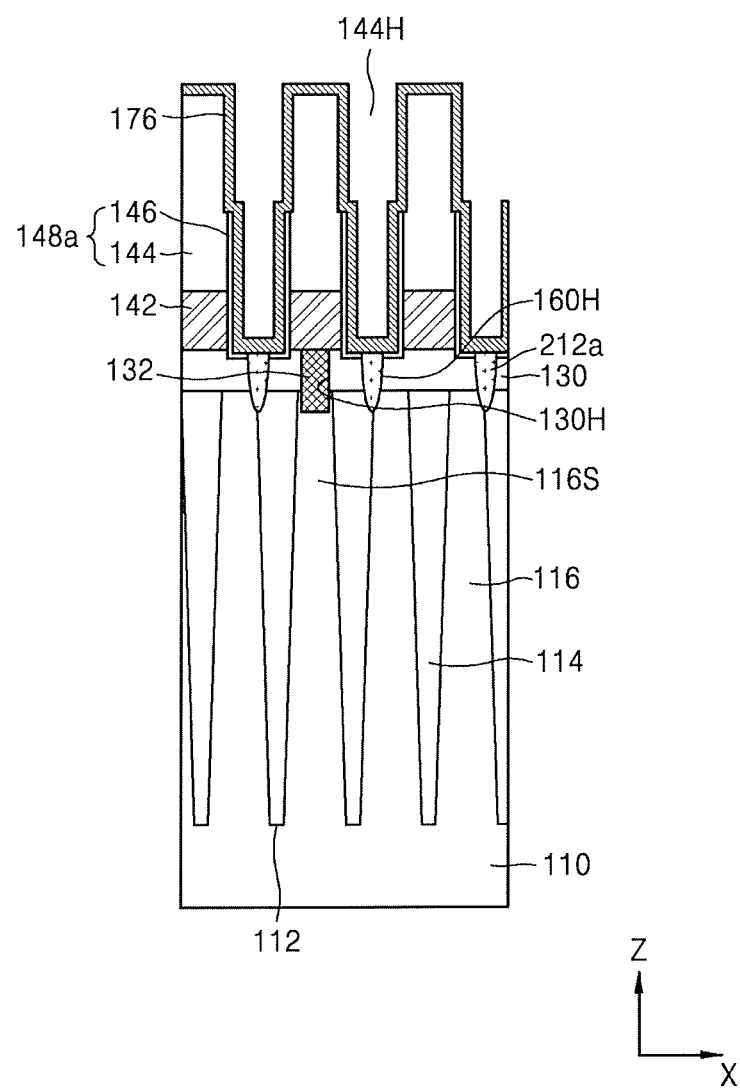

Referring to FIG. 26, the sacrificial spacer layer 176 which conformally covers the substrate 110 including the second space 144H may be formed. The sacrificial spacer layer 176 may cover an inner surface of the second space 144H, but may be formed not to fill all of the second space 144H.

Since a width of an upper portion of the second space 144H may be wider than that of a lower portion of the second space 144H, the sacrificial spacer layer 176 may have a curve in a boundary (e.g., a portion where a width of the bit line mask layer 148 is narrowed) between a lower portion 148B and an upper portion 148T of the bit line mask layer 148. That is, a distance between a plurality of the sacrificial spacer layers 176 which are respectively formed on side walls of adjacent bit line mask layers 148 limiting one the second space 144H may further increase in the upper portion 148T of the bit line mask layer 148 than the lower portion 148B of the bit line mask layer 148.

Subsequently, a process which is substantially the same as the process described above with reference to FIGS. 15 to 17 may be performed, and the remaining mold layer 212a filling the contact hole 160H may be removed in the process of removing the second mold layer 220 described above with reference to FIG. 18.

In the process of forming the first contact plug 180 described above with reference to FIG. 19, since the contact hole 160H has been already formed, the first contact plug 160 may be formed without performing the etch process described above with reference to FIG. 19.

Subsequently, the semiconductor device 100a having a shape similar to a shape illustrated in FIGS. 21 and 22 may be manufactured through the process described above with reference to FIGS. 20 and 21.

That is, except that a process of forming the contact hole 160H is changed, a method of manufacturing a semiconductor device described above with reference to FIGS. 23 to 26 substantially the same as the method of manufacturing a semiconductor device described above with reference to FIGS. 11 to 21, and thus, duplicative descriptions may be omitted.

Figure 27:
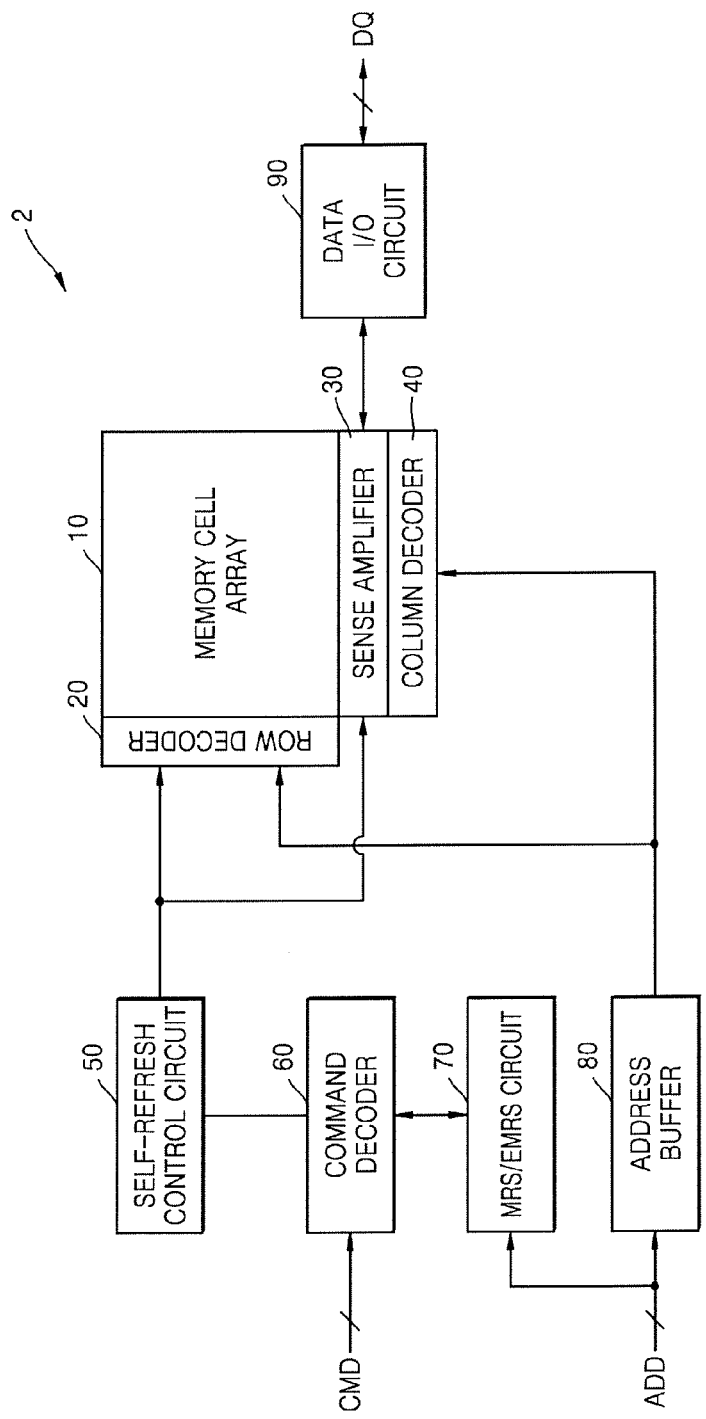
FIG. 27 is a block diagram illustrating a semiconductor device according to an exemplary embodiment of the present inventive concept.

FIG. 27 is a block diagram illustrating a semiconductor device according to an exemplary embodiment of the present inventive concept.

Referring to FIG. 27, a semiconductor device 2 may include a memory cell array 10, a row decoder 20, a sense amplifier 30, a column decoder 40, a self-refresh control circuit 50, a command decoder 60, a mode register set/extended mode register set (MRS/EMRS) circuit 70, an address buffer 80, and a data input/output (I/O) circuit 90. The semiconductor device 2 may include at least one of the semiconductor devices 1, 100 and 100a described above with reference to FIGS. 1 to 26.

The memory cell array 10 may include a plurality of memory cells which store data and are arranged in a row direction and a column direction. Each of the plurality of memory cells may include a cell capacitor and an access transistor. A gate of the access transistor may be connected to a corresponding word line among a plurality of word lines which are arranged in the row direction. One of a source and a drain of the access transistor may be connected to a bit line BL or a complementary bit line /BL which is arranged in plurality in the column direction, and the other may be connected to the cell capacitor.

The sense amplifier 30 may sense-amplify data of a corresponding memory cell and may store the data in the corresponding memory cell. The sense amplifier 30 may be implemented with a cross-coupled amplifier connected between the bit line BL and the complementary bit line /BL.

Data DQ input through the data I/O circuit 90 may be written in the memory cell array 10, based on an address signal ADD. The data DQ read from the memory cell array 10 may be output to the outside through the data I/O circuit 90, based on the address signal ADD. The address signal ADD may be input to the address buffer 80, for designating a memory cell in which data is to be written or from which data is to be read. The address buffer 80 may temporarily store the address signal ADD input from the outside.

The row decoder 20 may decode a row address included in the address signal ADD output from the address buffer 80, for designating a word line connected to a memory cell to which data is to be input or from which data is to be output.

That is, the row decoder 20 may decode the row address output from the address buffer 80 in a data write mode or a data read mode to enable a corresponding word line. The row decoder 20 may decode the row address generated from an address counter to enable a corresponding word line in a self-refresh mode.

The column decoder 40 may decode a column address included in the address signal ADD output from the address buffer 80, for designating a bit line connected to the memory cell to which the data is to be input or from which the data is to be output.

The memory cell array 10 may output or write the data from or in the memory cell designated by the row address and the column address.

The command decoder 60 may receive a command signal CMD applied from the outside and may decode the command signal CMD to internally generate a decoded command signal (for example, a self-refresh enter command, a self-refresh exit command).

The MRS/EMRS circuit 70 may set an internal mode register in response to an MRS/EMRS command and an address signal ADD for designating an operation mode of the semiconductor device 10.

The semiconductor device 2 may include a clock circuit for generating a clock signal and a power circuit that receives a source voltage applied from the outside to generate or distribute an internal voltage.

The self-refresh control circuit 50 may control a self-refresh operation of the semiconductor device 2 in response to a command output from the command decoder 60.

The command decoder 60 may include an address counter, a timer, and a core voltage generator. In response to the self-refresh enter command output from the command decoder 60, the address counter may generate a row address signal for designating a row address for which self-refresh is to be performed, and may apply the row address signal to the row decoder 20. The address counter may end a counting operation in response to the self-refresh exit command output from the command decoder 60.

The memory cell array 10 and the sense amplifier 30 may configure a memory core unit.

Figure 28:
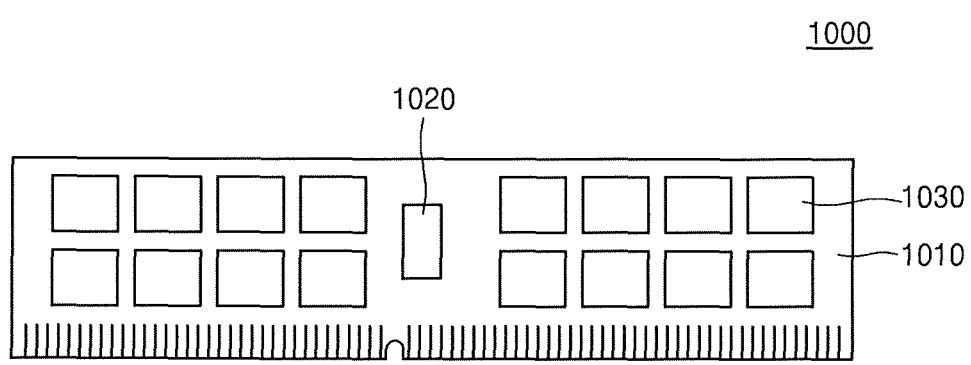
FIG. 28 is a plan view illustrating a main configuration of a semiconductor module according to an exemplary embodiment of the present inventive concept.

FIG. 28 is a plan view illustrating a main configuration of a semiconductor module according to an exemplary embodiment of the present inventive concept.

Referring to FIG. 28, a semiconductor module 1000 may include a module board 1010, a control chip 1020, and a plurality of semiconductor packages 1030. The control chip 1020 and the plurality of semiconductor packages 1030 may be disposed on the module board 1010.

The plurality of semiconductor packages 1030 may each include at least one of the semiconductor devices 1, 100 and 100a described above with reference to FIGS. 1 to 26.

Figure 29:
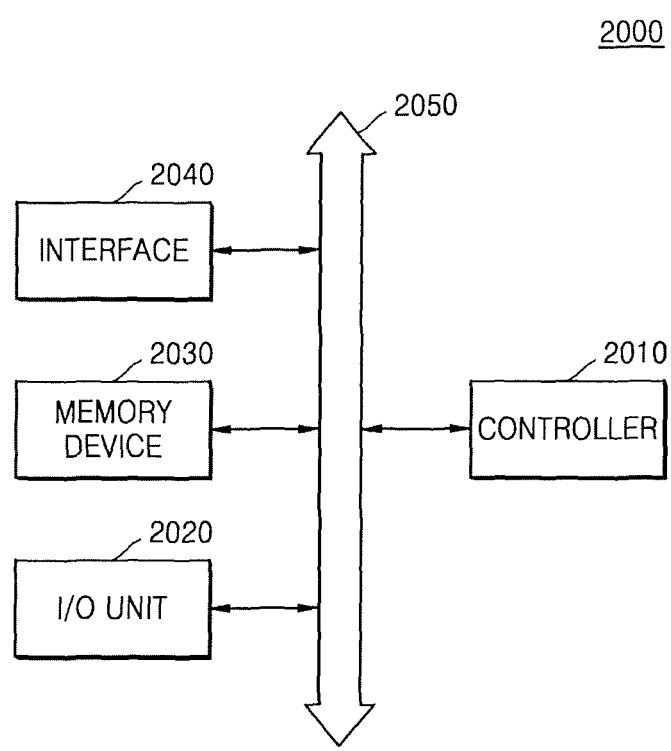
FIG. 29 is a block diagram illustrating a system including a semiconductor device according to an exemplary embodiment of the present inventive concept.

FIG. 29 is a block diagram illustrating a system including a semiconductor device according to an exemplary embodiment of the present inventive concept.

Referring to FIG. 29, a system 2000 may include a controller 2010, an input/output (I/O) unit 2020, a memory device 2030, and an interface 2040. The system 2000 may be a mobile system or a system which transmits or receives information. In some exemplary embodiments of the present inventive concept, the mobile system includes a personal digital assistant (PDA), a portable computer, a web tablet, a wireless phone, a mobile phone, a digital music player, or a memory card. The controller 2010 controls an execution program in the system 2000, and may include a microprocessor, a digital signal processor, a microcontroller, or a device similar thereto. The I/O unit 2020 may be used to input or output data to or from the system 2000. The system 2000 may be connected to an external device (e.g., a personal computer or a network) by using the I/O unit 2020, and may exchange data with the external device. The I/O unit 2020 may include, for example, a keypad, a keyboard, or a display.

The memory device 2030 may store a code and/or data which are/is used for an operation of the controller 2010, or store data obtained through processing of the controller 2010. The memory device 2030 includes a semiconductor device including a pin type field effect transistor according to an exemplary embodiment of the present inventive concept. For example, the memory device 2030 may include at least one of the semiconductor devices 1, 100 and 100*a* described above with reference to FIGS. 1 to 26.

The interface 2040 may be a data transmission path between the system 2000 and another external device. The controller 2010, the I/O unit 1020, the memory device 2030, and the interface 2040 may communicate with each other through a bus 2050. The system 2000 may be applied to mobile phones, MP3 players, navigation, portable multimedia players (PMPs), solid state disks (SSDs), and household appliances.

As described above, the semiconductor device according to the embodiments may include a contact plug configured with a first contact plug and a second contact plug, and even when a contact hole where the second contact plug is provided is enlarged for securing a margin for a connection between the first contact plug and the second contact plug, an air path for forming an air spacer is enlarged. Thus, a process margin for forming the contact plug may be secured, and the air spacer may reduce or eliminate a parasitic capacitance, thus increasing device performance and reliability.

While the present inventive concept has been particularly shown and described with reference to exemplary embodiments thereof, it will be understood that various changes in form and details may be made therein without departing from the spirit and scope of the present inventive concept.

What is claimed is:

1. A semiconductor device comprising:
    a substrate including a plurality of active areas;
    a conductive pattern in contact with an active area of the plurality of active areas; and
    first and second conductive line structures respectively facing first and second side walls of the conductive pattern,
    wherein an air spacer is disposed on each of the first and second side walls of the conductive pattern,
    wherein each of the first and second conductive line structures comprises a conductive line and a conductive line mask layer covering a top and a side of the conductive line,
    wherein the conductive line mask layer comprises a lower portion having a first width and an upper portion having a second width narrower than the first width,
    wherein each air spacer comprises a first air spacer disposed on a side wall of the lower portion of the conductive line mask layer and a second air spacer disposed on a side wall of the upper portion of the conductive line mask layer,
    wherein the second air spacer is connected with the first air spacer,
    wherein a first uppermost level of the second air spacer disposed on the first side wall of the conductive pattern is different than a second uppermost level of the second air space disposed on the second side wall of the conductive pattern, and
    wherein neither of the first uppermost level and the second uppermost level are higher than a uppermost level of the conductive line mask layer.

2. The semiconductor device of claim 1, wherein the air spacer extends along a nonlinear path.

3. The semiconductor device of claim 1, wherein a boundary between the lower portion and the upper portion of the conductive line mask layer has a level higher than a level of the top of the conductive line.

4. The semiconductor device of claim 1, wherein the first air spacer has a line shape extending in a first direction.

5. The semiconductor device of claim 4, wherein the first air spacer comprises a plurality of first air spacers, and wherein an upper end of each of the first air spacers has a substantially constant level.

6. The semiconductor device of claim 1, wherein the second air spacer surrounds a periphery of the conductive pattern.

7. The semiconductor device of claim 6, wherein the second air spacer is connected with the first air spacer between the first side wall and the first conductive line structure and between the second side wall and the second conductive line structure.

8. The semiconductor device of claim 1, wherein the second air spacer has a line shape extending in a first direction.

9. The semiconductor device of claim 8, wherein the second air spacer comprises a first portion, which overlaps the first air spacer in a vertical direction with respect to an upper surface of the substrate, and a second portion that does not overlap the first air spacer.

10. The semiconductor device of claim 1, wherein a portion of the second air spacer disposed between the first side wall and the first conductive line structure and another portion of the second air spacer disposed between the second side wall and the second conductive line structure has a non-linear shape.

11. The semiconductor device of claim 1, wherein the conductive pattern comprises a first conductive pattern disposed between the first and second conductive line structures and a second conductive pattern connected to the first conductive pattern, and wherein the second conductive pattern extends from between the first and second conductive line structures to a top of one of the first and second conductive line structures.

12. The semiconductor device of claim 11, wherein the second conductive pattern covers an upper end of a portion of the second air spacer.

13. The semiconductor device of claim 12, wherein an upper end of a portion of the second air spacer covered by the second conductive pattern has a level higher than a level of an upper end of a portion of the second air spacer uncovered by the second conductive pattern.

14. A semiconductor device comprising:
    a substrate including a plurality of active areas;
    a conductive pattern in contact with an active area of the plurality of active areas; and
    first and second conductive line structures respectively facing first and second side walls of the conductive pattern,
    wherein an air spacer is disposed between the first and second side walls, wherein each of the first and second conductive line structures comprises a conductive line and a conductive line mask layer covering a top and a side of the conductive line, wherein the conductive line mask layer includes a lower portion having a first width and an upper portion having a second width narrower than the first width, wherein the air spacer extends along a side wall of the lower portion of the conductive line mask layer and extends to a portion of a side wall of the upper portion of the conductive line mask layer, wherein the conductive pattern comprises a first conductive pattern disposed between the first and second conductive line structures and a second conductive pattern connected to the first conductive pattern, and wherein the second conductive pattern extends from between the first and second conductive line structures to a top of one of the first and second conductive line structures, wherein the second conductive pattern covers an upper end of a portion of the second air spacer, and wherein an upper end of a portion of the second air spacer covered by the second conductive pattern has a level higher than a level of an upper end of a portion of the second air spacer uncovered by the second conductive pattern.

15. The semiconductor device of claim 14, wherein a portion of the air spacer disposed between the first side wall and the first conductive line structure and a portion of the air spacer disposed between the second side wall and the second conductive line structure have a mutually asymmetrical shape.

16. The semiconductor device of claim 14, wherein the air spacer is formed in a space which extends along a nonlinear path near a boundary between the lower portion and the upper portion of the conductive line mask layer.

17. The semiconductor device of claim 14, wherein a portion of the air spacer disposed between the first side wall and the first conductive line structure and another portion of the air spacer disposed between the second side wall and the second conductive line structure have different heights with respect to the conductive pattern.

18. A semiconductor device comprising:
a substrate comprising at least one active area;
a bit line disposed on the substrate;
a first conductive pattern penetrating the bit line and in contact with the at least one active area; and
a second conductive pattern disposed on the first conductive pattern, wherein the first and second conductive patterns include a first side wall on a first side of the first and second conductive patterns and a second side wall on a second opposing side of the first and second conductive patterns, wherein an air spacer comprising a first air spacer and a second air spacer is disposed between the first and second side walls, wherein the first air spacer is disposed in a lower portion of the first and second conductive patterns between the first and second side walls, wherein the second air spacer is disposed in an upper portion of the first and second conductive patterns between the first and second side walls, wherein the second air spacer is connected with the first air spacer, wherein the second air spacer is offset from the first air spacer along a vertical direction with respect to an upper surface of the substrate, and wherein the second air spacer includes a plurality of second air spacers, and wherein some of the second air spacers have different heights from some other second air spacers with respect to the upper surface of the substrate.

19. The semiconductor device of claim 18, wherein the first air spacer comprises a plurality of first air spacers, and wherein an upper end of each of the first air spacers has a substantially constant level with respect to the upper surface of the substrate.

* * * * *